United States Patent
Chen et al.

(10) Patent No.: US 12,218,104 B2
(45) Date of Patent: Feb. 4, 2025

(54) METHOD FOR FORMING CHIP PACKAGE STRUCTURE WITH MOLDING LAYER

(71) Applicant: TAIWAN SEMICONDUCTOR MANUFACTURING COMPANY, LTD., Hsinchu (TW)

(72) Inventors: Wei-Yu Chen, New Taipei (TW); An-Jhih Su, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/884,162

(22) Filed: Aug. 9, 2022

(65) Prior Publication Data

US 2022/0384213 A1 Dec. 1, 2022

Related U.S. Application Data

(60) Division of application No. 16/801,395, filed on Feb. 26, 2020, now Pat. No. 11,469,215, which is a
(Continued)

(51) Int. Cl.
*H01L 25/065* (2023.01)
*H01L 21/48* (2006.01)
(Continued)

(52) U.S. Cl.
CPC ...... *H01L 25/0657* (2013.01); *H01L 21/4857* (2013.01); *H01L 21/486* (2013.01);
(Continued)

(58) Field of Classification Search
CPC ............. H01L 25/0657; H01L 21/4857; H01L 21/486; H01L 21/565; H01L 21/568;
(Continued)

(56) References Cited

U.S. PATENT DOCUMENTS

| 7,550,857 B1 | 6/2009 | Longo et al. |
| 8,361,842 B2 | 1/2013 | Yu et al. |

(Continued)

FOREIGN PATENT DOCUMENTS

| CN | 102931102 A | 2/2013 |
| CN | 103633075 A | 3/2014 |

OTHER PUBLICATIONS

U.S. Office Action dated Dec. 27, 2022 for U.S. Appl. No. 16/983,315.
(Continued)

*Primary Examiner* — Bitew A Dinke
(74) *Attorney, Agent, or Firm* — Birch, Stewart, Kolasch & Birch, LLP

(57) ABSTRACT

A method for forming a chip package structure is provided. The method includes forming a first molding layer surrounding a first chip structure. The method includes disposing a second chip structure over the first chip structure and the first molding layer. The method includes forming a second molding layer surrounding the second chip structure and over the first chip structure and the first molding layer. The method includes forming a third molding layer surrounding the first molding layer and the second molding layer. The method includes disposing a third chip structure over the second chip structure, the second molding layer and the third molding layer. The method includes forming a fourth molding layer surrounding the third chip structure and over the second chip structure, the second molding layer, and the third molding layer.

20 Claims, 30 Drawing Sheets

Related U.S. Application Data continuation-in-part of application No. 15/801,846, filed on Nov. 2, 2017, now Pat. No. 10,734,357, which is a division of application No. 15/208,764, filed on Jul. 13, 2016, now Pat. No. 9,825,007.

(60) Provisional application No. 62/894,360, filed on Aug. 30, 2019.

(51) Int. Cl.
| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |
| *H01L 25/00* | (2006.01) |
| *H01L 25/03* | (2006.01) |

(52) U.S. Cl.
CPC .......... *H01L 21/565* (2013.01); *H01L 21/568* (2013.01); *H01L 23/3128* (2013.01); *H01L 23/3135* (2013.01); *H01L 23/49811* (2013.01); *H01L 23/49816* (2013.01); *H01L 23/5389* (2013.01); *H01L 24/12* (2013.01); *H01L 24/19* (2013.01); *H01L 24/20* (2013.01); *H01L 24/97* (2013.01); *H01L 25/03* (2013.01); *H01L 25/0652* (2013.01); *H01L 25/50* (2013.01); *H01L 21/561* (2013.01); *H01L 2224/04105* (2013.01); *H01L 2224/12105* (2013.01); *H01L 2224/19* (2013.01); *H01L 2224/24145* (2013.01); *H01L 2224/24227* (2013.01); *H01L 2224/32145* (2013.01); *H01L 2224/32225* (2013.01); *H01L 2224/73267* (2013.01); *H01L 2224/83005* (2013.01); *H01L 2224/97* (2013.01); *H01L 2225/06517* (2013.01); *H01L 2225/06548* (2013.01); *H01L 2225/06568* (2013.01); *H01L 2225/06582* (2013.01); *H01L 2225/06596* (2013.01); *H01L 2924/18162* (2013.01); *H01L 2924/3511* (2013.01)

(58) Field of Classification Search
CPC ............. H01L 23/3128; H01L 23/3135; H01L 23/49811; H01L 23/49816; H01L 23/5389; H01L 24/12; H01L 24/19; H01L 24/20; H01L 24/97; H01L 25/03; H01L 25/0652; H01L 25/50; H01L 21/561; H01L 2224/04105; H01L 2224/12105; H01L 2224/19; H01L 2224/24145; H01L 2224/24227; H01L 2224/32145; H01L 2224/32225; H01L 2224/73267; H01L 2224/83005; H01L 2224/97; H01L 2225/06517; H01L 2225/06548; H01L 2225/06568; H01L 2225/06582; H01L 2225/06596; H01L 2924/18162; H01L 2924/3511; H01L 2224/18; H01L 2224/92244; H01L 2221/68331; H01L 2224/96; H01L 2225/06524; H01L 2225/06562; H01L 2225/06586; H01L 21/6835; H01L 2221/68345; H01L 2221/68359

See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 8/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,564,419 B2* | 2/2017 | Chen .................. | H01L 24/02 |
| 9,666,502 B2 | 5/2017 | Chen et al. | |
| 9,735,131 B2 | 8/2017 | Su et al. | |
| 9,806,059 B1 | 10/2017 | Lee et al. | |
| 9,825,007 B1* | 11/2017 | Chen .................. | H01L 21/4857 |
| 9,859,245 B1 | 1/2018 | Chen et al. | |
| 9,917,072 B2 | 3/2018 | Yu et al. | |
| 9,984,998 B2 | 5/2018 | Yu et al. | |
| 10,083,927 B2 | 9/2018 | Chen et al. | |
| 10,128,213 B2* | 11/2018 | Yu ..................... | H01L 24/20 |
| 10,163,701 B2 | 12/2018 | Lee et al. | |
| 10,347,606 B2 | 7/2019 | Yu et al. | |
| 10,692,789 B2 | 6/2020 | Liu et al. | |
| 10,734,357 B2* | 8/2020 | Chen .................. | H01L 21/4857 |
| 10,811,394 B2 | 10/2020 | Yu et al. | |
| 10,854,565 B2 | 12/2020 | Chen et al. | |
| 11,469,215 B2* | 10/2022 | Chen .................. | H01L 24/20 |
| 2003/0134488 A1 | 7/2003 | Yamazaki et al. | |
| 2006/0125072 A1 | 6/2006 | Mihara | |
| 2009/0134528 A1* | 5/2009 | Lee .................. | H01L 24/19 |
| | | | 257/E23.141 |
| 2010/0178731 A1 | 7/2010 | Mihara | |
| 2010/0193930 A1* | 8/2010 | Lee .................. | H01L 24/24 |
| | | | 257/E23.173 |
| 2010/0290191 A1* | 11/2010 | Lin .................. | H01L 24/82 |
| | | | 361/764 |
| 2012/0038064 A1 | 2/2012 | Camacho et al. | |
| 2013/0040423 A1 | 2/2013 | Tung et al. | |
| 2013/0062760 A1 | 3/2013 | Hung et al. | |
| 2013/0062761 A1 | 3/2013 | Lin et al. | |
| 2013/0071969 A1 | 3/2013 | Vodrahalli et al. | |
| 2013/0093078 A1 | 4/2013 | Lin et al. | |
| 2013/0147063 A1* | 6/2013 | Park .................. | H01L 24/96 |
| | | | 257/777 |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0015131 A1 | 1/2014 | Meyer et al. | |
| 2014/0015145 A1 | 1/2014 | Cho et al. | |
| 2014/0097535 A1 | 4/2014 | He et al. | |
| 2014/0203429 A1 | 7/2014 | Yu et al. | |
| 2014/0203457 A1 | 7/2014 | Kim et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0123288 A1* | 5/2015 | Lee .................. | H01L 21/76879 |
| | | | 438/109 |
| 2015/0262928 A1 | 9/2015 | Shen et al. | |
| 2015/0303174 A1* | 10/2015 | Yu .................. | H01L 24/19 |
| | | | 438/109 |
| 2016/0013156 A1 | 1/2016 | Zhai et al. | |
| 2016/0086918 A1 | 3/2016 | Lin et al. | |
| 2016/0118273 A1 | 4/2016 | Cho et al. | |
| 2016/0148904 A1* | 5/2016 | Zhai .................. | H01L 21/4853 |
| | | | 438/109 |
| 2016/0260684 A1 | 9/2016 | Zhai et al. | |
| 2016/0260695 A1 | 9/2016 | Chung et al. | |
| 2016/0284668 A1* | 9/2016 | Chen .................. | H01L 24/19 |
| 2016/0300813 A1 | 10/2016 | Zhai et al. | |
| 2016/0307872 A1 | 10/2016 | Chen et al. | |
| 2016/0315071 A1* | 10/2016 | Zhai .................. | H01L 24/73 |
| 2017/0033080 A1* | 2/2017 | Chen .................. | H01L 25/0657 |
| 2017/0084555 A1* | 3/2017 | Yu .................. | H01L 23/5389 |
| 2017/0084576 A1* | 3/2017 | Yu .................. | H01L 21/56 |

(56) References Cited

U.S. PATENT DOCUMENTS

| | | | |
|---|---|---|---|
| 2017/0098629 A1* | 4/2017 | Liu | H01L 24/20 |
| 2017/0133351 A1* | 5/2017 | Su | H01L 23/5389 |
| 2017/0194292 A1* | 7/2017 | Yu | H01L 21/78 |
| 2017/0243855 A1 | 8/2017 | Kim | |
| 2017/0287870 A1* | 10/2017 | Fang | H01L 23/552 |
| 2017/0287874 A1 | 10/2017 | Fang et al. | |
| 2017/0330858 A1* | 11/2017 | Lee | H01L 21/6835 |
| 2017/0373041 A1* | 12/2017 | Kim | H01L 24/32 |
| 2018/0026019 A1 | 1/2018 | Tao et al. | |
| 2018/0053746 A1 | 2/2018 | Yu et al. | |
| 2018/0122764 A1 | 5/2018 | Chen et al. | |
| 2018/0138083 A1* | 5/2018 | Kim | H01L 21/76877 |
| 2018/0151530 A1 | 5/2018 | Chen et al. | |
| 2018/0277520 A1 | 9/2018 | Yu et al. | |
| 2019/0006309 A1 | 1/2019 | Jeng et al. | |
| 2019/0027454 A1 | 1/2019 | Chen et al. | |
| 2019/0057940 A1* | 2/2019 | Cheah | H01L 25/50 |
| 2019/0074261 A1 | 3/2019 | Yu et al. | |
| 2020/0075542 A1* | 3/2020 | Sung | H01L 24/16 |
| 2020/0194404 A1 | 6/2020 | Chen et al. | |
| 2021/0167039 A1* | 6/2021 | Zeng | H01L 23/3135 |
| 2022/0384213 A1* | 12/2022 | Chen | H01L 25/03 |

OTHER PUBLICATIONS

German Office Action for German Application No. 10 2020 106 459.4, dated Apr. 20, 2022.
U.S. Office Action for U.S. Appl. No. 16/983,315, dated May 9, 2022.

* cited by examiner

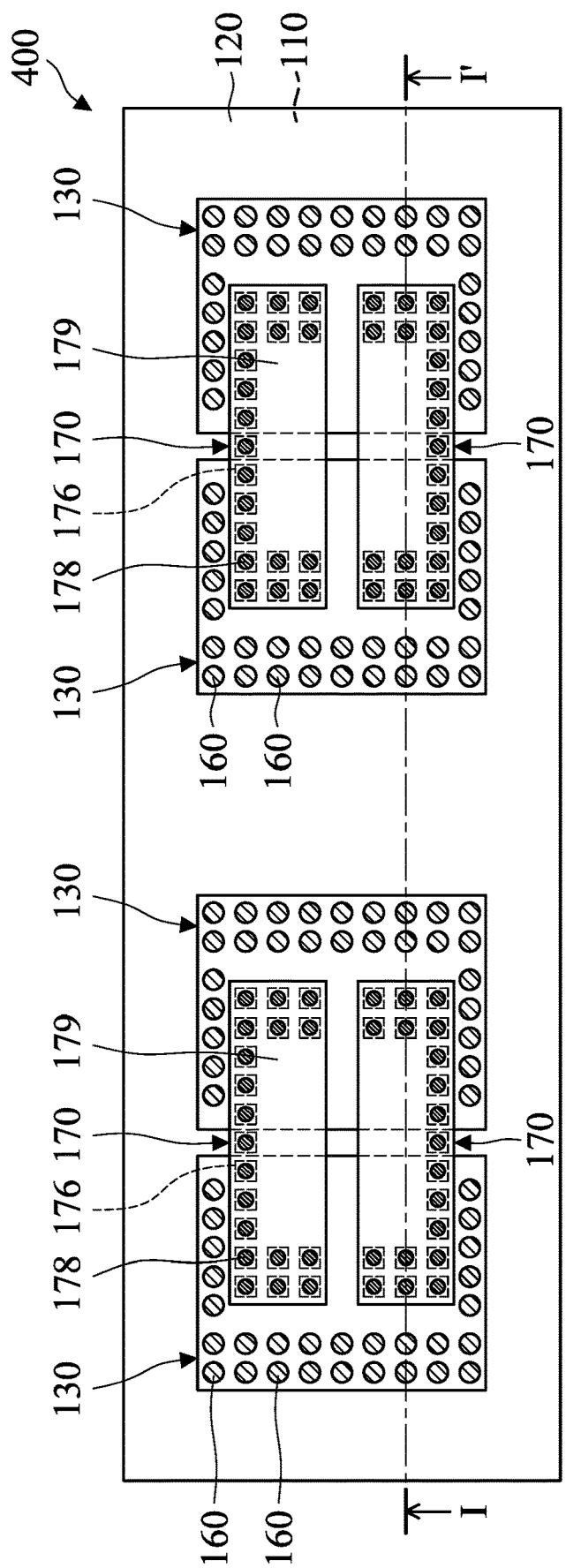
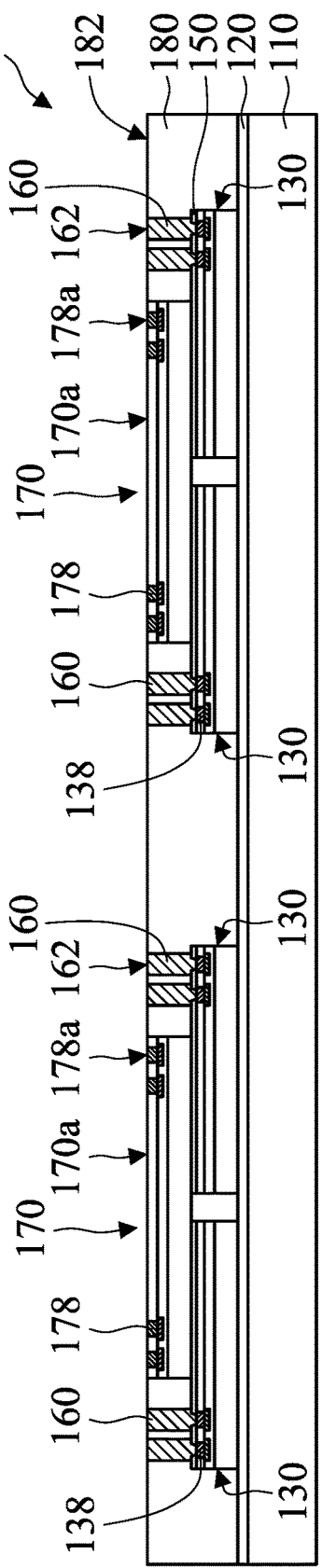
FIG. 2B-1
FIG. 2C

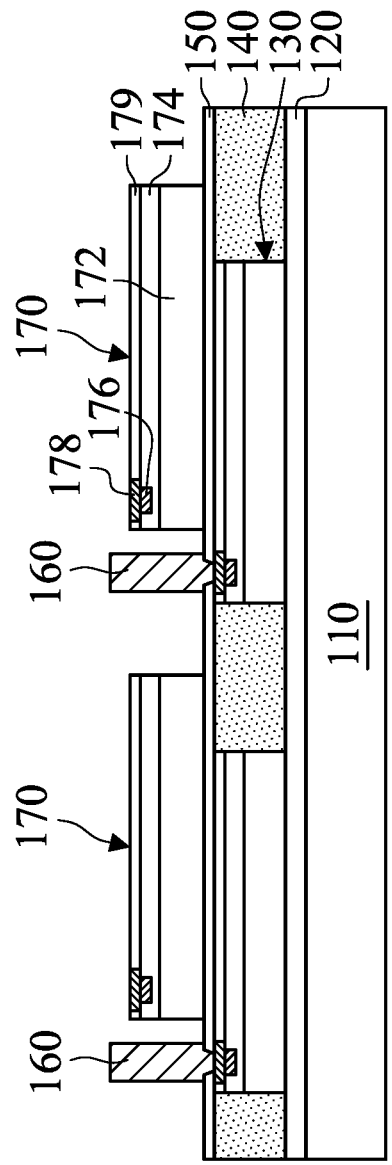
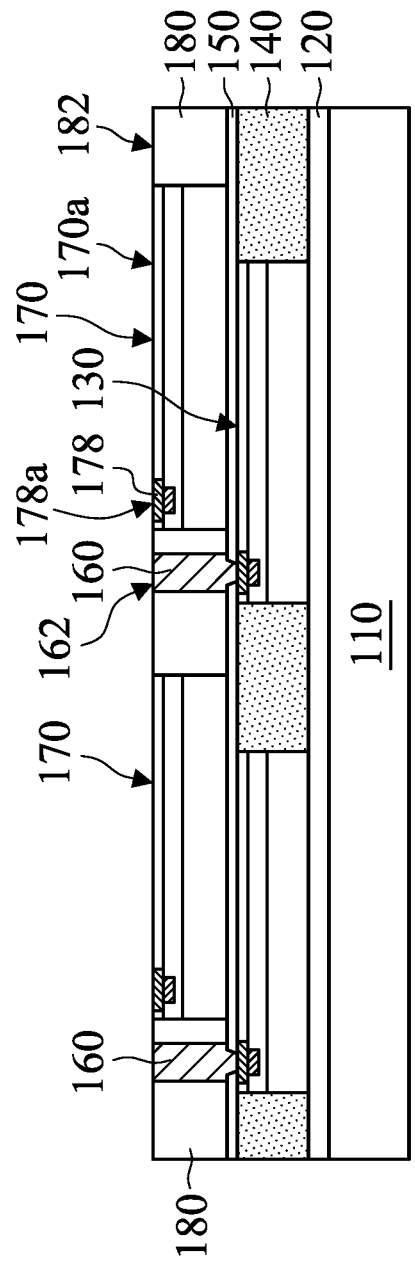
FIG. 3C
FIG. 3D

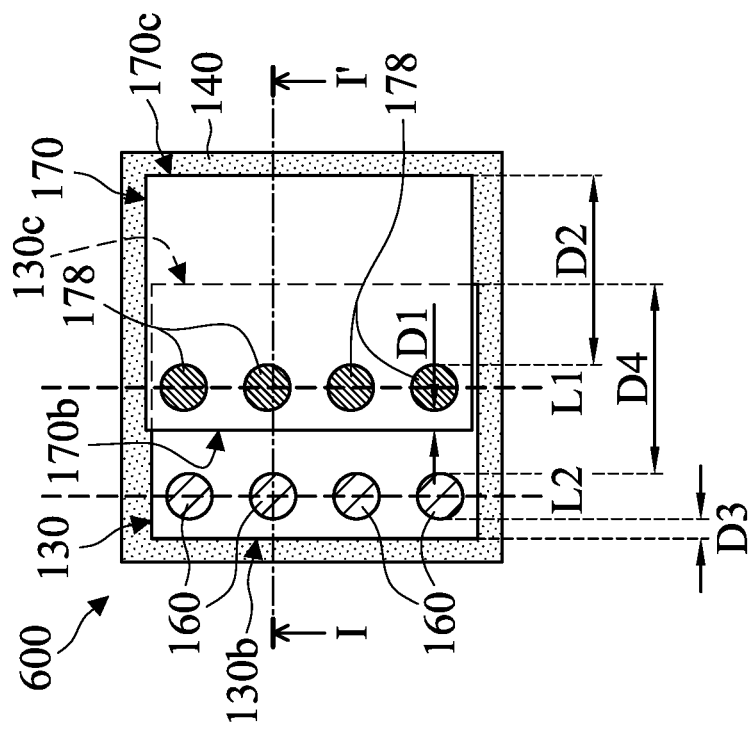
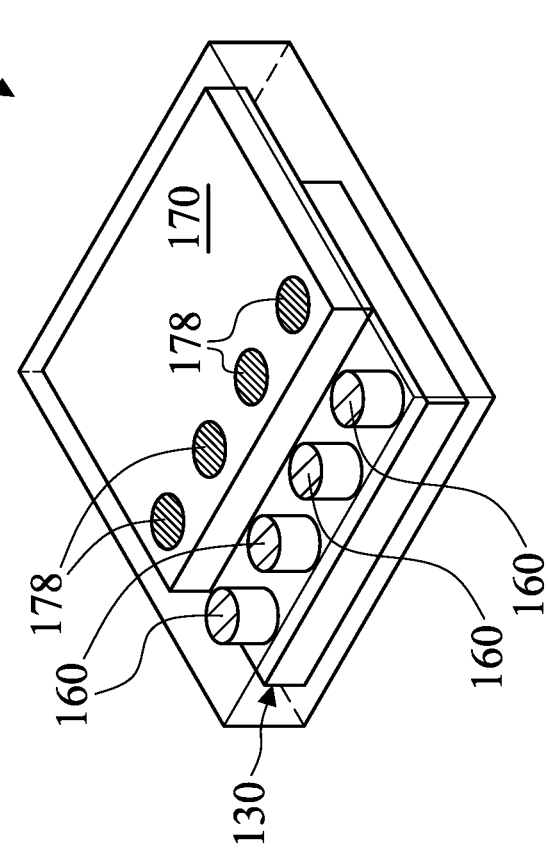
FIG. 4A
FIG. 4B

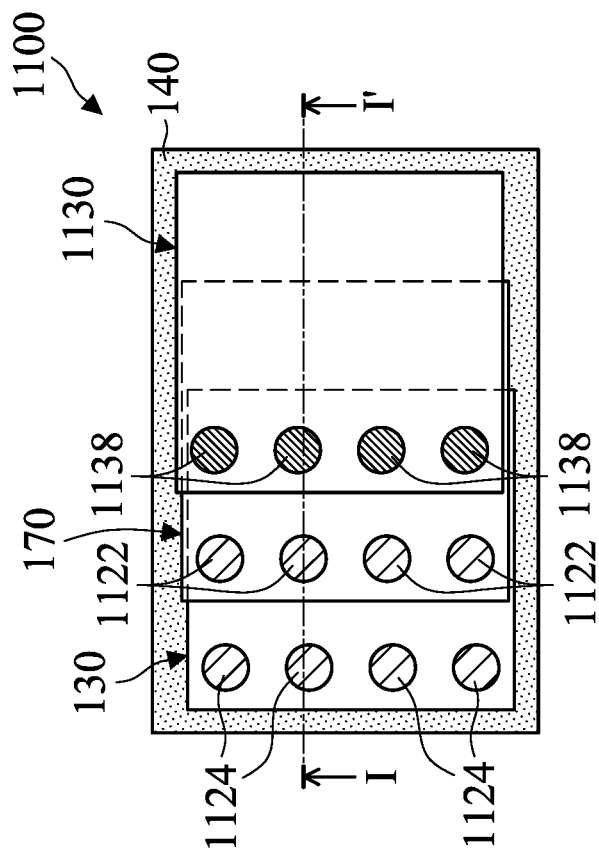
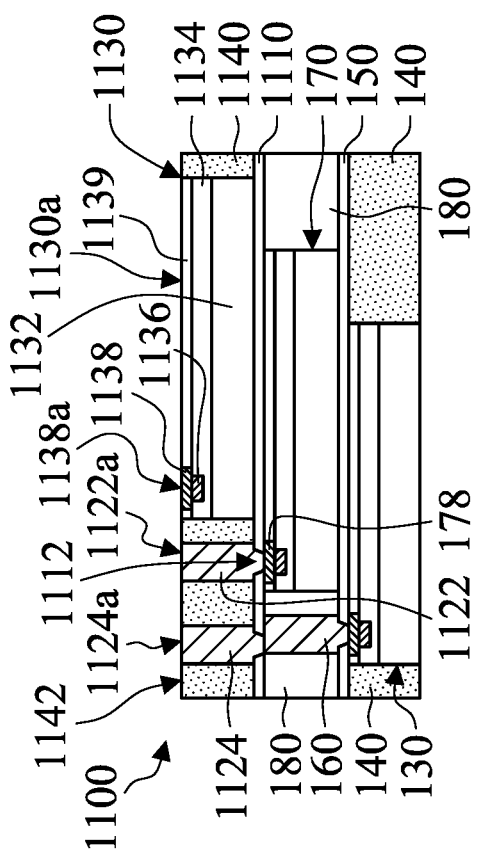
FIG. 11A
FIG. 11B

METHOD FOR FORMING CHIP PACKAGE STRUCTURE WITH MOLDING LAYER

PRIORITY CLAIM AND CROSS-REFERENCE

This application is a Divisional of U.S. application Ser. No. 16/801,395, filed on Feb. 26, 2020, which is a Continuation-In-Part of pending U.S. application Ser. No. 15/801, 846, filed on Nov. 2, 2017, which is a Divisional of U.S. application Ser. No. 15/208,764, filed on Jul. 13, 2016. This application Ser. No. 16/801,395 claims the benefit of U.S. Provisional Application No. 62/894,360, filed on Aug. 30, 2019, and entitled "CHIP PACKAGE STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1C-1 and 1H-1 are top views of the chip package structure of FIGS. 1C and 1H, in accordance with some embodiments.

FIGS. 2A-2H are cross-sectional views of various stages of a process for forming a chip package structure, in accordance with some embodiments.

FIGS. 2B-1 and 2H-1 are top views of the chip package structure of FIGS. 2B and 2H, in accordance with some embodiments.

FIGS. 3A-3E are cross-sectional views of various stages of a process for forming a chip package structure, in accordance with some embodiments.

FIG. 4A is a top view of the chip package structure of FIG. 3E, in accordance with some embodiments.

FIG. 4B is a perspective view of the chip package structure of FIG. 3E, in accordance with some embodiments.

FIG. 9C-1 is a top view of the chip package structure of FIG. 9C, in accordance with some embodiments.

FIG. 9C-2 is a cross-sectional view illustrating the chip package structure along a sectional line II-II' in FIG. 9C-1, in accordance with some embodiments.

FIG. 11A is a cross-sectional view of a chip package structure, in accordance with some embodiments.

FIG. 11B is a top view of the chip package structure of FIG. 11A, in accordance with some embodiments.

DETAILED DESCRIPTION

Figure 1A:
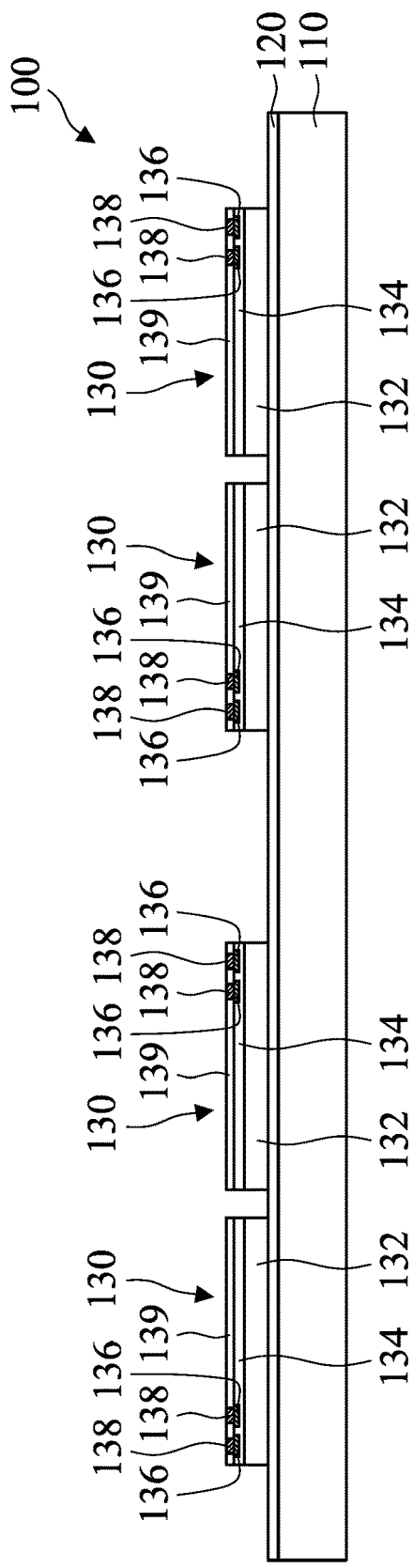
FIGS. 1A-1H are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by persons skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
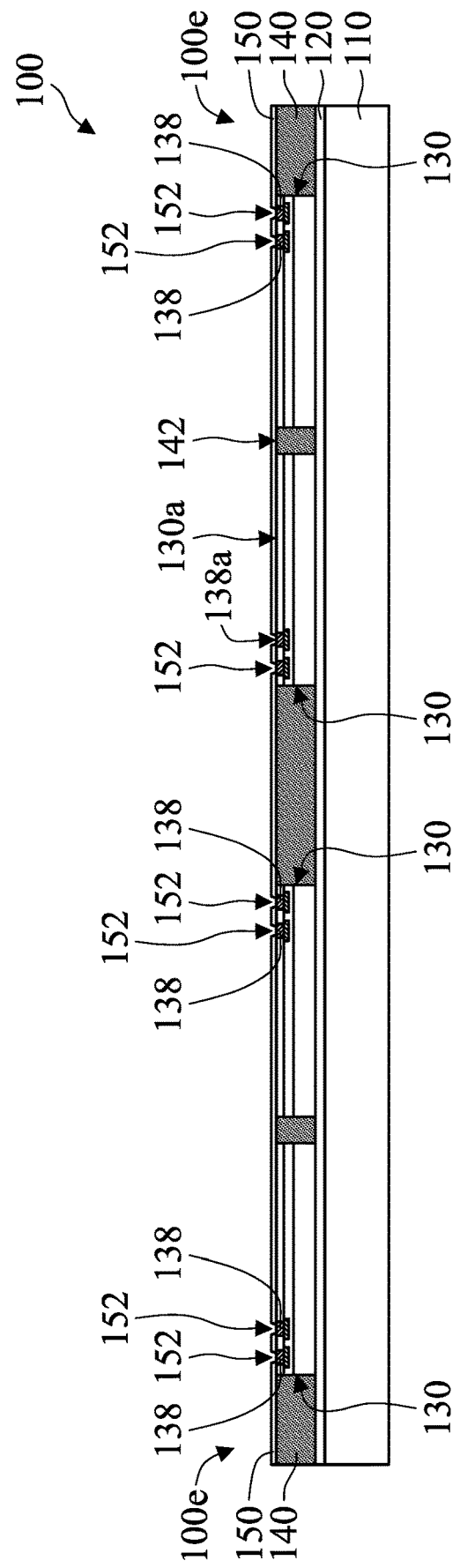
Figure 1C:
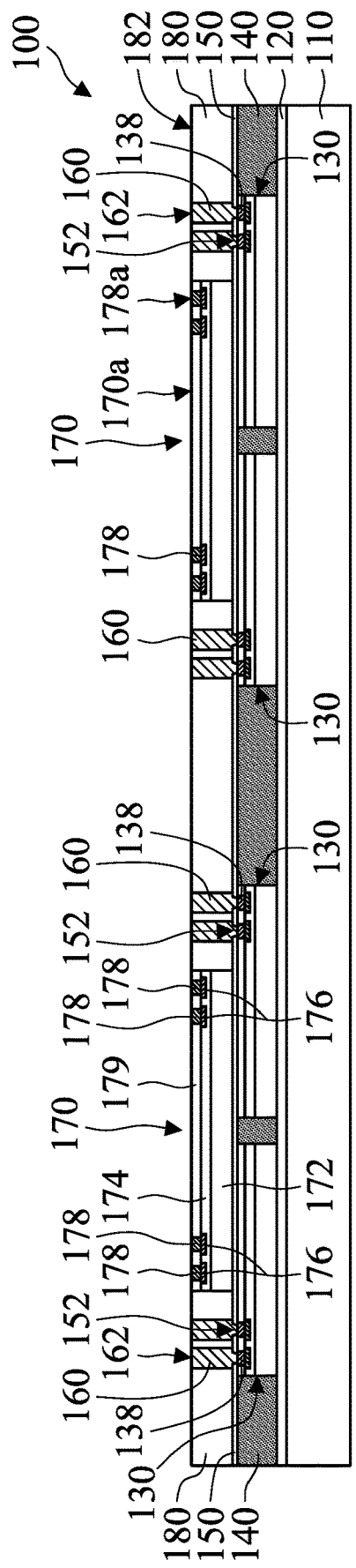
Figures 1, 1C:
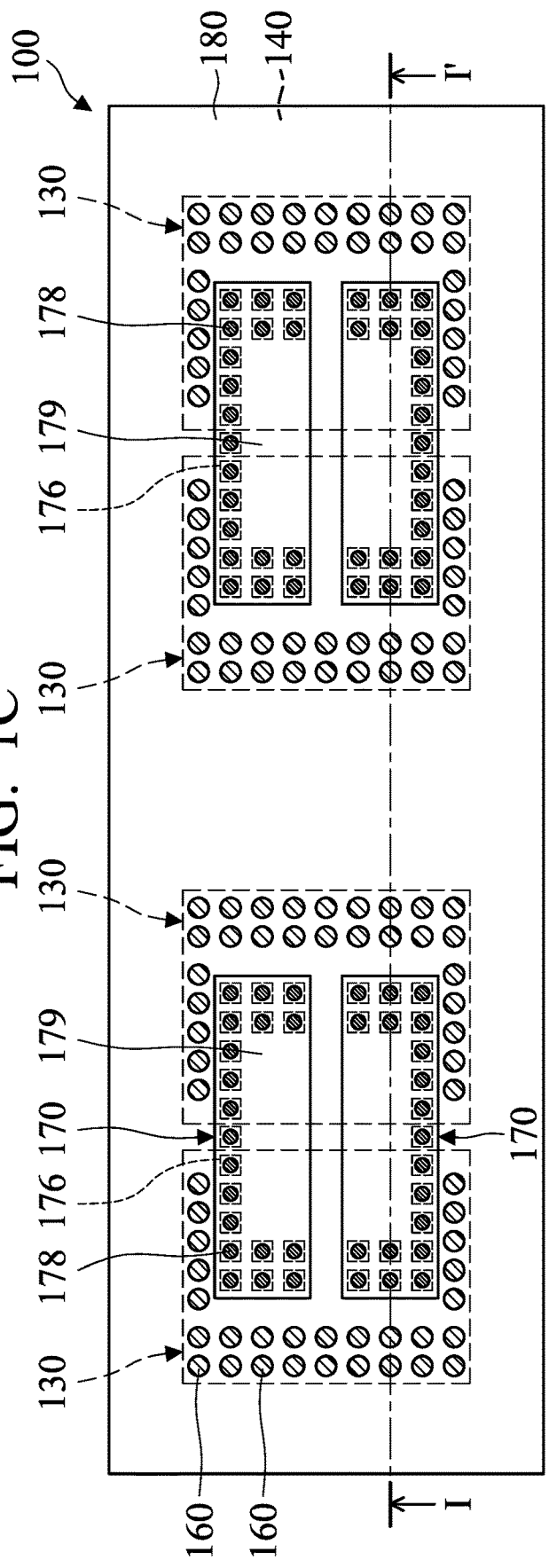
Figure 1D:
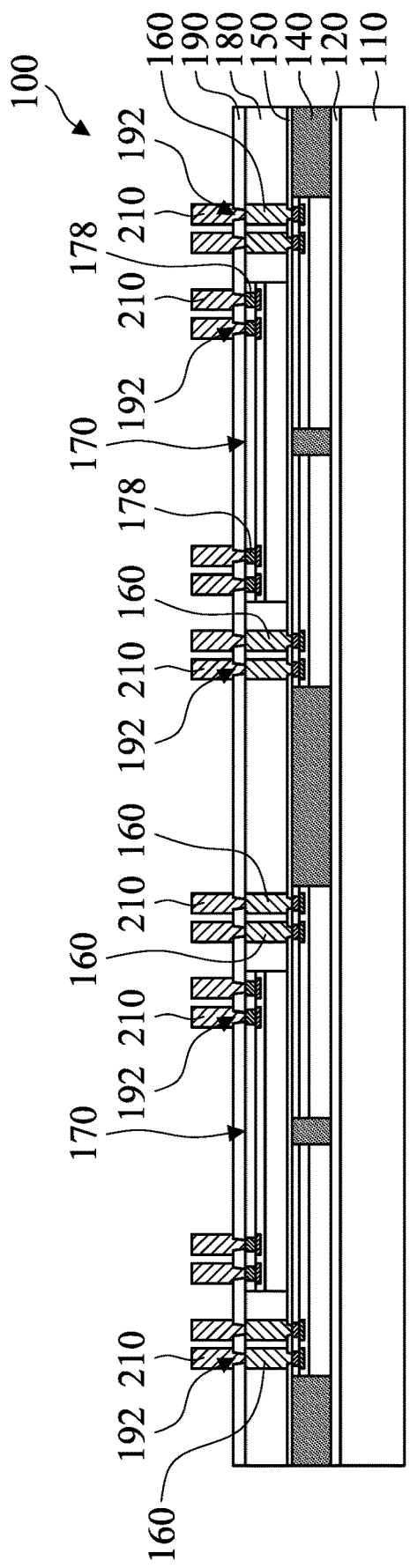
Figure 1E:
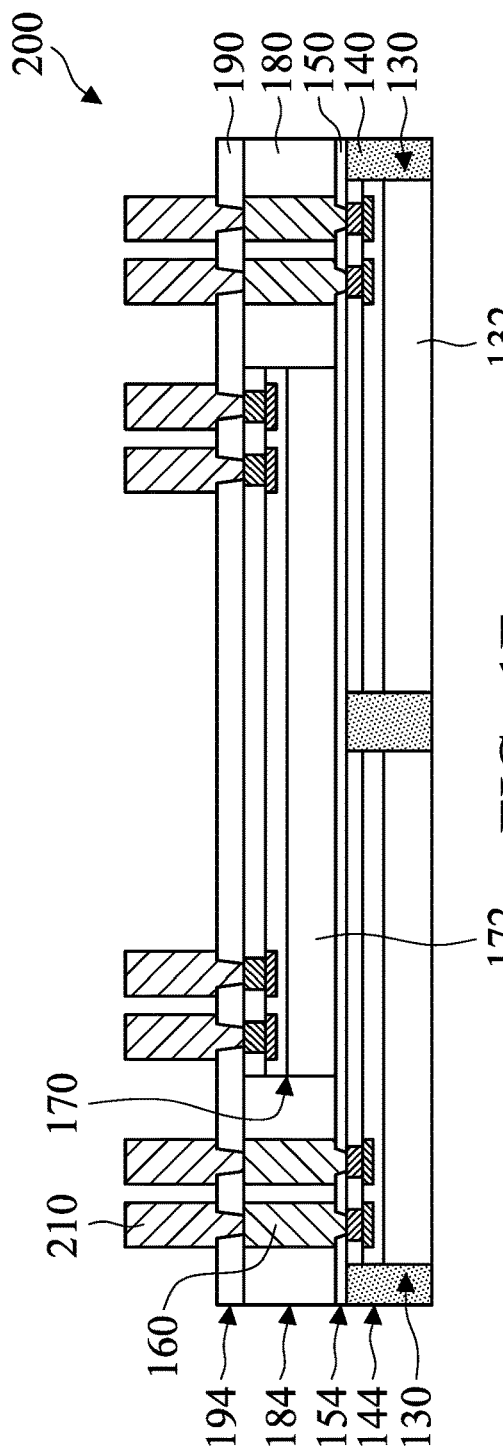
Figure 1F:
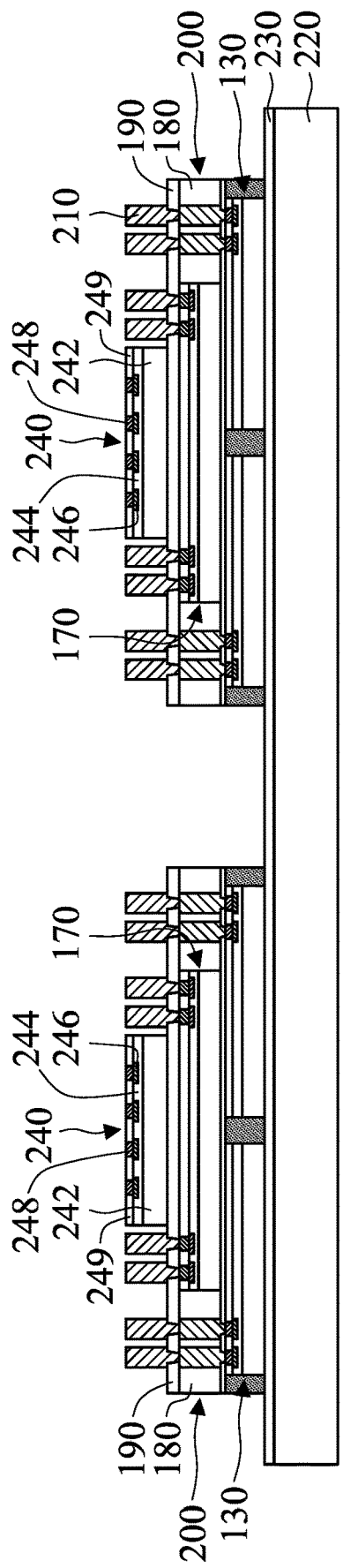
Figure 1G:
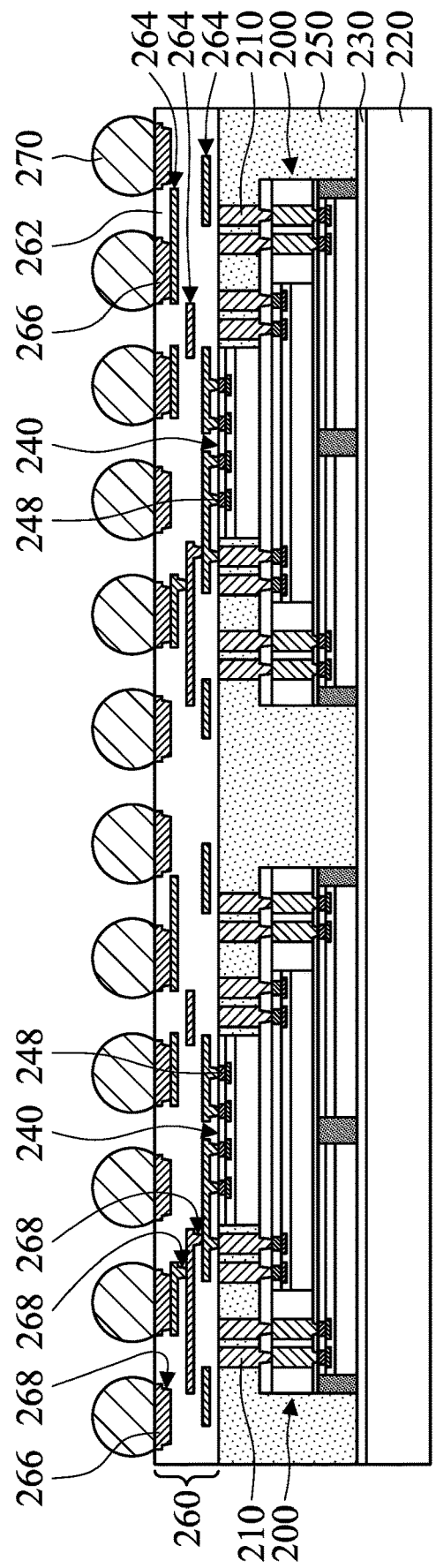
Figure 1H:
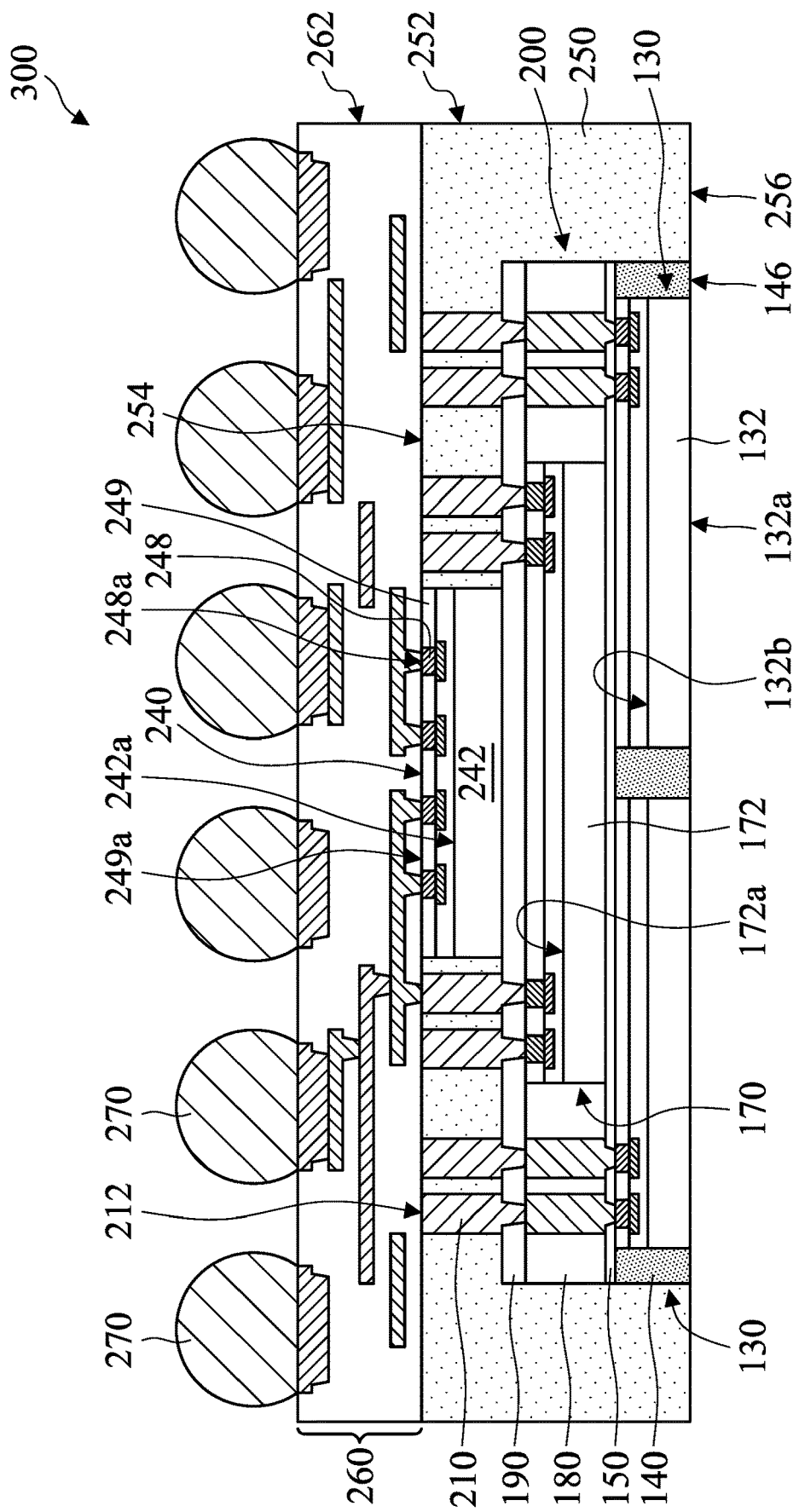
Figures 1, 1H:
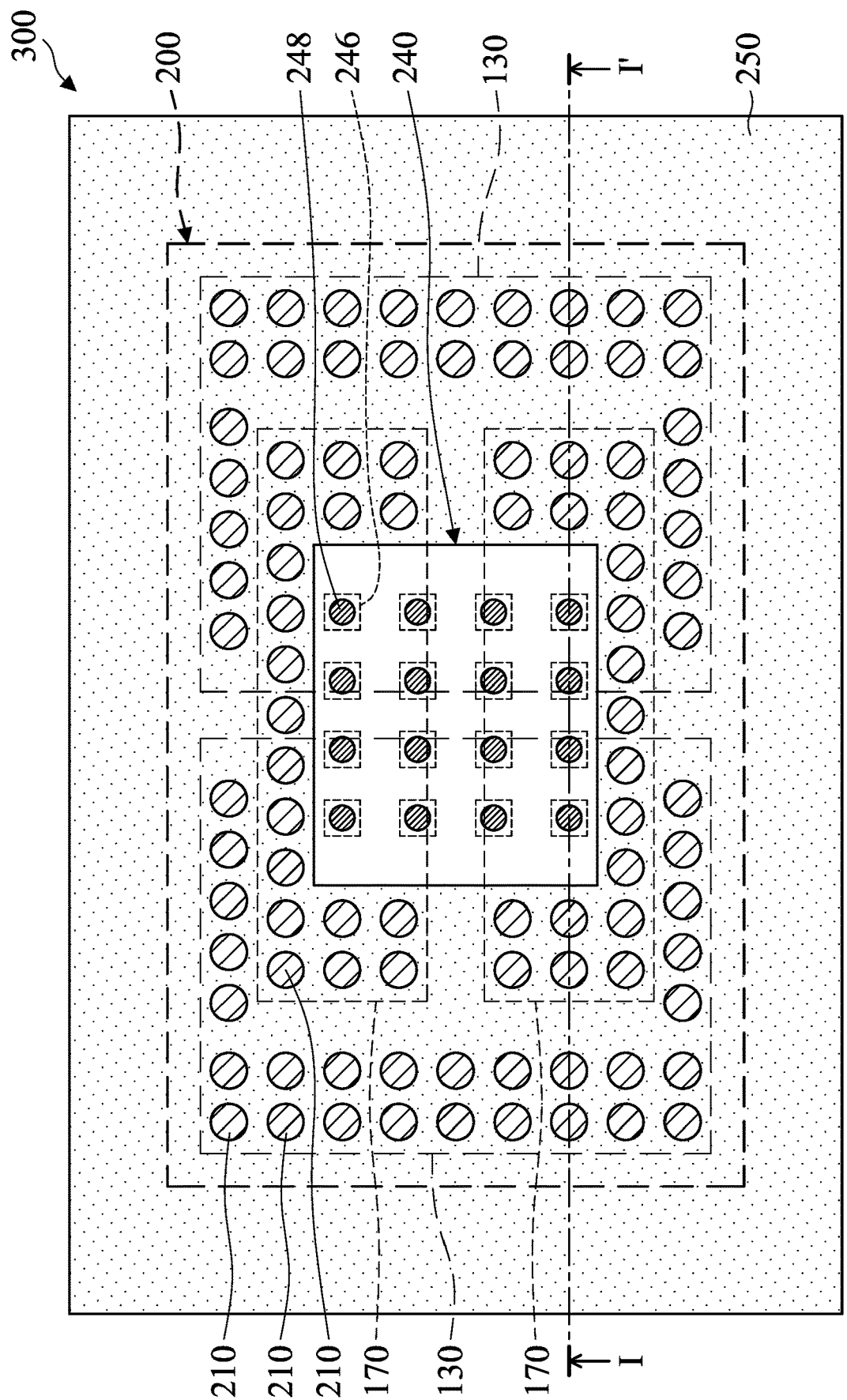

FIGS. 1A-1H are cross-sectional views of various stages of a process for forming a chip package structure, in accordance with some embodiments. FIGS. 1C-1 and 1H-1 are top views of the chip package structure of FIGS. 1C and 1H, in accordance with some embodiments. FIG. 1C is a cross-sectional view illustrating the package 100 along a sectional line I-I' in FIG. 1C-1, in accordance with some embodiments. FIG. 1H is a cross-sectional view illustrating the chip package structure 300 along a sectional line I-I' in FIG. 1H-1, in accordance with some embodiments.

As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, a combination thereof, and/or the like, in accordance with some embodiments. The carrier substrate 110 includes a wafer, in accordance with some embodiments.

As shown in FIG. 1A, an adhesive layer 120 is formed over the carrier substrate 110, in accordance with some embodiments. The adhesive layer 120 includes any suitable adhesive material, such as a polymer material, in accordance with some embodiments. For example, the adhesive layer 120 includes an ultraviolet (UV) glue, which loses its adhesive properties when exposed to UV light, in accordance with some embodiments. In some embodiments, the adhesive layer 120 includes a double sided adhesive tape. The adhesive layer 120 is formed using a lamination process, a spin coating process, or another suitable process.

As shown in FIG. 1A, chip structures 130 are provided over the adhesive layer 120, in accordance with some embodiments. Each of the chip structures 130 includes a chip 132, a dielectric layer 134, bonding pads 136, interconnection structures 138, and a passivation layer 139, in accordance with some embodiments. The dielectric layer 134 is formed over the chip 132, in accordance with some embodiments.

The dielectric layer 134 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 134 is formed using a CVD process, a HDPCVD process, a spin-on process, a sputtering process, or a combination thereof, in accordance with some embodiments.

The bonding pads 136 are formed in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments. The passivation layer 139 includes a polymer material or another suitable insulating material.

As shown in FIG. 1B, a molding layer 140 is formed over the carrier substrate 110 and the adhesive layer 120, in accordance with some embodiments. The molding layer 140 surrounds the chip structures 130, in accordance with some embodiments. In some embodiments, portions of the molding layer 140 are located between the chip structures 130. The molding layer 140 includes a polymer material or another suitable insulating material. The carrier substrate 110 and the molding layer 140 are made of different materials, in accordance with some embodiments.

The formation of the molding layer 140 includes forming a molding compound material layer over the adhesive layer 120; performing a curing process to cross-link (or thermoset) the polymers of the molding compound material layer; performing a grinding process over the molding compound material layer until the interconnection structures 138 are exposed, in accordance with some embodiments. Therefore, top surfaces 138a, 130a, and 142 of the interconnection structures 138, the chip structures 130, and the molding layer 140 are substantially coplanar, in accordance with some embodiments.

As shown in FIG. 1B, an insulating layer 150 is formed over the molding layer 140 and the chip structures 130, in accordance with some embodiments. The insulating layer 150 is a continuous layer, in accordance with some embodiments. The insulating layer 150 has holes 152 over the interconnection structures 138, in accordance with some embodiments. The holes 152 respectively expose the interconnection structures 138 thereunder, in accordance with some embodiments.

Due to varying coefficients of thermal expansion (CTEs) of different elements of the package 100, the package 100 tends to warp (or bow) upwardly at the edges 100e of the package 100, in accordance with some embodiments. Therefore, for eliminating or reducing the warpage of the package 100, the coefficient of thermal expansion of the material of the carrier substrate 110 is less than the coefficient of thermal expansion of the material of the molding layer 140, in accordance with some embodiments.

As shown in FIG. 3D, conductive pillars 160 are formed in and over the holes 152 to be electrically connected to the interconnection structures 138, respectively, in accordance with some embodiments. The conductive pillars 160 include copper or another suitable conductive material.

As shown in FIG. 3D, chip structures 170 are provided over the insulating layer 150, in accordance with some embodiments. The chip structures 170 are positioned over the chip structures 130 and the molding layer 140, in accordance with some embodiments.

In some embodiments, a portion of each of the chip structures 130 is exposed by the chip structures 170. The chip structures 170 are between the conductive pillars 160, in accordance with some embodiments. The conductive pillars 160 surround the chip structures 170, in accordance with some embodiments.

Each of the chip structures 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The dielectric layer 174 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 174 is formed using a CVD process, a HDPCVD process, a spin-on process, a sputtering process, or a combination thereof, in accordance with some embodiments.

The bonding pads 176 are formed in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

As shown in FIG. 3D, a molding layer 180 is formed over the insulating layer 150, in accordance with some embodiments. The insulating layer 150 separates the molding layer 140 and the chip structures 130 from the molding layer 180 and the chip structures 170, in accordance with some embodiments. The molding layer 180 is over the chip structures 130 and the molding layer 140, in accordance with some embodiments.

The molding layer 180 surrounds the chip structures 170 and the conductive pillars 160, in accordance with some embodiments. In some embodiments, portions of the molding layer 180 are between the chip structures 170 and the conductive pillars 160. The molding layer 180 includes a polymer material or another suitable insulating material.

The formation of the molding layer 180 includes forming a molding compound material layer over the insulating layer 150; performing a curing process to cross-link (or thermoset) the polymers of the molding compound material layer; performing a grinding process over the molding compound material layer until the conductive pillars 160 and the interconnection structures 178 are exposed, in accordance with some embodiments.

Therefore, top surfaces 178a, 170a, 162, and 182 of the interconnection structures 178, the chip structures 170, the conductive pillars 160, and the molding layer 180 are substantially coplanar, in accordance with some embodiments. The conductive pillars 160 pass through the molding layer 180, in accordance with some embodiments.

As shown in FIG. 1D, an insulating layer 190 is formed over the molding layer 180 and the chip structures 170, in accordance with some embodiments. The insulating layer 190 has holes 192 over the conductive pillars 160 and the interconnection structures 178, in accordance with some embodiments. The holes 192 respectively expose the conductive pillars 160 thereunder and the interconnection structures 178 thereunder, in accordance with some embodiments.

As shown in FIG. 1D, conductive pillars 210 are formed in and over the holes 192 to be electrically connected to the conductive pillars 160 and the interconnection structures 178, respectively, in accordance with some embodiments. The conductive pillars 210 include copper or another suitable conductive material.

As shown in FIG. 1E, the chip structures 130 and the molding layer 140 are debonded from the carrier substrate 110, in accordance with some embodiments. The debonding process includes performing a thermal process over the adhesive layer 120, in accordance with some embodiments. For example, the adhesive layer 120 is irradiated with UV light to weaken the adhesive properties of the adhesive layer 120.

As shown in FIG. 1E, a sawing process is performed over the insulating layer 190, the molding layer 180, the insulating layer 150, and the molding layer 140 to form individual chip package structures 200, in accordance with some embodiments. Each of the chip package structures 200 includes the chip structures 130, the molding layer 140, the insulating layer 150, the conductive pillars 160, the chip structures 170, the molding layer 180, the insulating layer 190, and the conductive pillars 210, in accordance with some embodiments.

In each of the chip package structures 200, side walls 194, 184, 154, and 144 of the insulating layer 190, the molding layer 180, the insulating layer 150, and the molding layer 140 are substantially coplanar, in accordance with some embodiments. The molding layers 140 and 180 together form a molding structure, in accordance with some embodiments.

As shown in FIG. 1F, a carrier substrate 220 is provided, in accordance with some embodiments. The carrier substrate 220 is configured to provide temporary mechanical and structural support during subsequent processing steps, in accordance with some embodiments. The carrier substrate 220 includes glass, silicon oxide, aluminum oxide, a combination thereof, and/or the like, in accordance with some embodiments. The carrier substrate 220 includes a wafer, in accordance with some embodiments.

As shown in FIG. 1F, an adhesive layer 230 is formed over the carrier substrate 220, in accordance with some embodiments. The adhesive layer 230 includes any suitable adhesive material, such as a polymer material, in accordance with some embodiments.

For example, the adhesive layer 230 includes an ultraviolet (UV) glue, which loses its adhesive properties when exposed to UV light, in accordance with some embodiments. In some embodiments, the adhesive layer 230 includes a double sided adhesive tape. The adhesive layer 230 is formed using a lamination process, a spin coating process, or another suitable process.

As shown in FIG. 1F, the chip package structures 200 are disposed over the adhesive layer 230, in accordance with some embodiments. As shown in FIG. 1F, chip structures 240 are provided over the chip package structures 200, respectively, in accordance with some embodiments.

The chip structure 240 is over the chip structures 170 and the molding layer 180 of one of the chip package structures 200, in accordance with some embodiments. The insulating layer 190 separates the chip structures 170 thereunder from the chip structure 240 thereover, in accordance with some embodiments.

Each of the chip structures 240 includes a chip 242, a dielectric layer 244, bonding pads 246, interconnection structures 248, and a passivation layer 249, in accordance with some embodiments. The dielectric layer 244 is formed over the chip 242, in accordance with some embodiments.

The dielectric layer 244 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The dielectric layer 244 is formed using a CVD process, a HDPCVD process, a spin-on process, a sputtering process, or a combination thereof, in accordance with some embodiments. The bonding pads 246 are formed in the dielectric layer 244, in accordance with some embodiments. The bonding pads 246 are electrically connected to devices (not shown) formed in/over the chip 242, in accordance with some embodiments.

The interconnection structures 248 are formed over the bonding pads 246 respectively, in accordance with some embodiments. The interconnection structures 248 include conductive pillars or conductive bumps, in accordance with some embodiments. The passivation layer 249 is formed over the dielectric layer 244 and surrounds the interconnection structures 248, in accordance with some embodiments. The passivation layer 249 includes a polymer material or another suitable insulating material.

As shown in FIG. 1G, a molding layer 250 is formed over the adhesive layer 230 and the chip package structures 200, in accordance with some embodiments. The molding layer 250 surrounds the chip package structures 200 and the chip structures 240, in accordance with some embodiments. The molding layer 250 includes a polymer material or another suitable insulating material.

The carrier substrate 110 and the molding layer 250 are made of different materials, in accordance with some embodiments. For eliminating or reducing the warpage of the package of FIG. 1G, the coefficient of thermal expansion of the material of the carrier substrate 110 is less than the coefficient of thermal expansion of the material of the molding layer 250, in accordance with some embodiments.

The formation of the molding layer 250 includes forming a molding compound material layer over the adhesive layer 230 and the chip package structures 200; performing a curing process to cross-link (or thermoset) the polymers of the molding compound material layer; performing a grinding process over the molding compound material layer until the interconnection structures 248 are exposed, in accordance with some embodiments.

As shown in FIG. 1G, a wiring structure 260 is formed over the molding layer 250, the chip structures 240, and the chip package structures 200, in accordance with some embodiments. The wiring structure 260 includes a dielectric layer 262, wiring layers 264, conductive pads 266, and conductive vias 268, in accordance with some embodiments. The wiring layers 264 and conductive vias 268 are in the dielectric layer 262, in accordance with some embodiments. The conductive pads 266 are over the dielectric layer 262, in accordance with some embodiments.

The conductive vias 268 are between the conductive pads 266, the wiring layers 264, the conductive pillars 210, and the interconnection structures 248, in accordance with some embodiments. Therefore, the conductive pads 266, the wiring layers 264, the conductive pillars 210, and the interconnection structures 248 are able to be electrically connected to each other through the conductive vias 268 according to design requirements, in accordance with some embodiments.

As shown in FIG. 1G, conductive bumps 270 are formed over the conductive pads 266, respectively, in accordance with some embodiments. The conductive bumps 270 include tin (Sn) or another suitable conductive material. The formation of the conductive bumps 270 includes forming a solder paste over the conductive pads 266 and reflowing the solder paste, in accordance with some embodiments.

As shown in FIGS. 1H and 1H-1, the chip package structures 200 and the molding layer 250 are debonded from the carrier substrate 220, in accordance with some embodiments. The debonding process includes performing a thermal process over the adhesive layer 230, in accordance with some embodiments. For example, the adhesive layer 230 is irradiated with UV light to weaken the adhesive properties of the adhesive layer 230.

As shown in FIGS. 1H and 1H-1, a sawing process is performed over the wiring structure 260 and the molding layer 250 to form individual chip package structures 300, in accordance with some embodiments. For the sake of simplicity, the conductive bumps 270 and the wiring structure 260 are omitted in FIG. 1H-1, in accordance with some embodiments.

Each of the chip package structures 300 includes the chip package structure 200, the chip structure 240, the molding layer 250, the wiring structure 260, and the conductive bumps 270, in accordance with some embodiments. In the chip package structure 300, side walls 262 and 252 of the wiring structure 260 and the molding layer 250 are substantially coplanar, in accordance with some embodiments.

In the chip package structure 300, top surfaces 212, 254, 249a, and 248a of the conductive pillars 210, the molding layer 250, the passivation layer 249, and the interconnection structures 248 are substantially coplanar, in accordance with some embodiments. The conductive pillars 210 pass through the molding layer 250, in accordance with some embodiments. The molding layer 250 continuously surrounds the entire chip package structures 200 and the entire chip structure 240, in accordance with some embodiments. The molding layer 250 is a single layer structure, in accordance with some embodiments.

In some embodiments, a bottom surface 132a of the chip 132, a bottom surface 146 of the molding layer 140, and a bottom surface 256 of the molding layer 250 are substantially coplanar. The molding layer 250 surrounds the insulating layers 190 and 150, in accordance with some embodiments. The molding layer 140 does not cover top surfaces 132b of the chips 132, in accordance with some embodiments. The molding layer 140 does not cover bottom surfaces 132a of the chips 132, in accordance with some embodiments.

The molding layer 180 does not cover top surfaces 172a of the chips 172, in accordance with some embodiments. The molding layer 250 does not cover a top surface 242a of the chip 242, in accordance with some embodiments. The chip package structure 300 is a fan-out chip package structure, in accordance with some embodiments.

The process of FIGS. 1A-1H includes performing a sawing process to form individual chip package structures 200; disposing the chip package structures 200 over the carrier substrate 220; forming the molding layer 250 over the adhesive layer 230 and the chip package structures 200; removing the carrier substrate 220; and performing a sawing process to form the individual chip package structures 300, in accordance with some embodiments.

Therefore, during the process of FIGS. 1A-1H, the warpage of the chip package structure 300 is eliminated or reduced twice by selecting the materials of the molding layer 140 and the carrier substrate 110 and the materials of the molding layer 250 and the carrier substrate 220, in accordance with some embodiments. As a result, the warpage of the chip package structure 300 is reduced to an acceptable level, in accordance with some embodiments. Therefore, the yield of the chip package structures 300 is improved, in accordance with some embodiments.

Since the sawing process of FIG. 1E and the disposing of the chip package structures 200 over the carrier substrate 220 of FIG. 1F are performed, the chip package structure 200 is smaller than the chip package structure 300. Therefore, if the carrier substrates 110 and 220 have the same size (e.g. a wafer size), the number of the chip package structures 200 over the carrier substrate 110 is greater than the number of the chip package structures 300 over the carrier substrate 220. Therefore, the cost of the process of forming the chip package structures 200 is reduced, in accordance with some embodiments.

In some embodiments, an electrical property test (e.g. a final test) is performed over the conductive pillars 210 of FIG. 1D to identify known good dies (KGDs). Thereafter, in the step of FIG. 1F, the chip package structures 200 with the known good dies are picked up and disposed over the carrier substrate 220 to form the chip package structures 300, in accordance with some embodiments.

Therefore, the process of FIGS. 1A-1H prevents the chip package structures 300 from having the chip package structures 200 with bad dies, in accordance with some embodiments. Therefore, the yield of the chip package structures 300 is improved, in accordance with some embodiments.

Figure 2A:
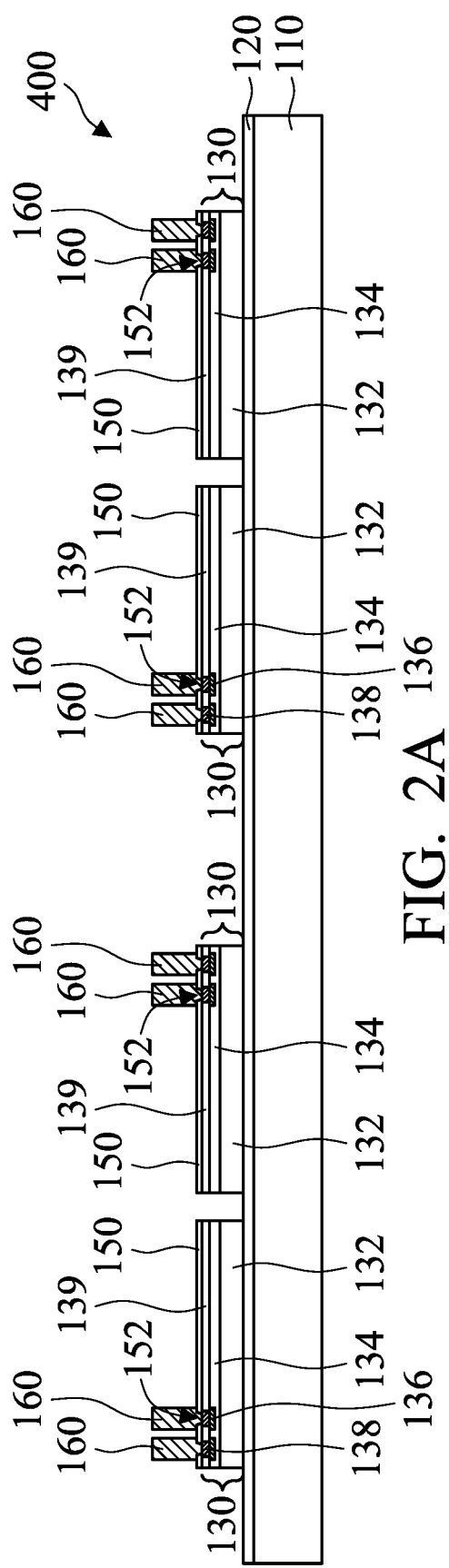
Figure 2B:
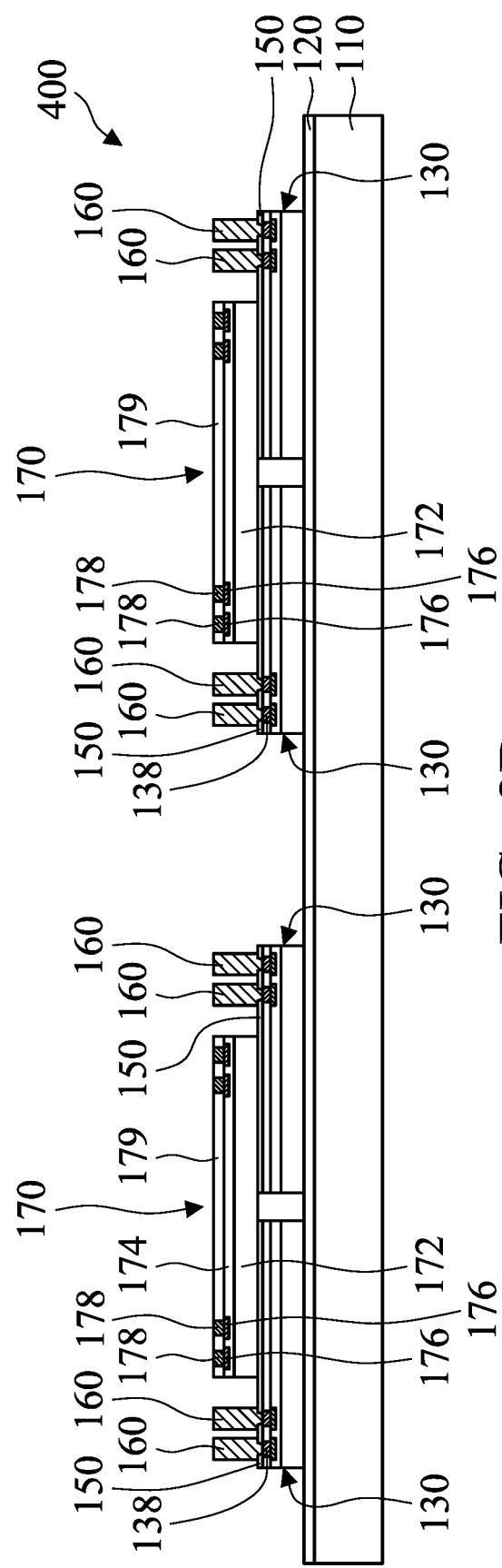
Figure 2D:
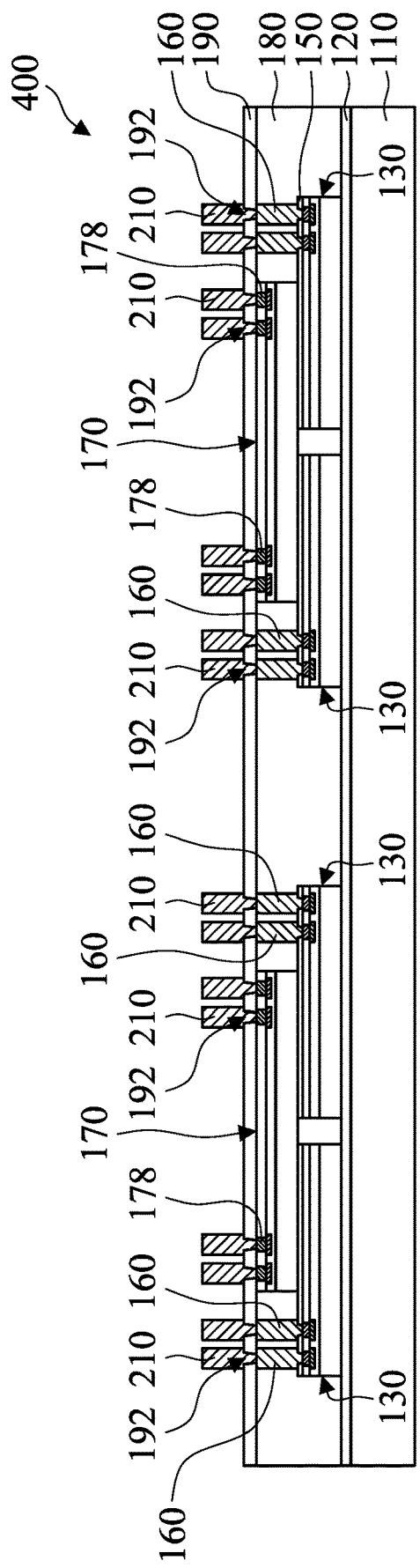
Figure 2E:
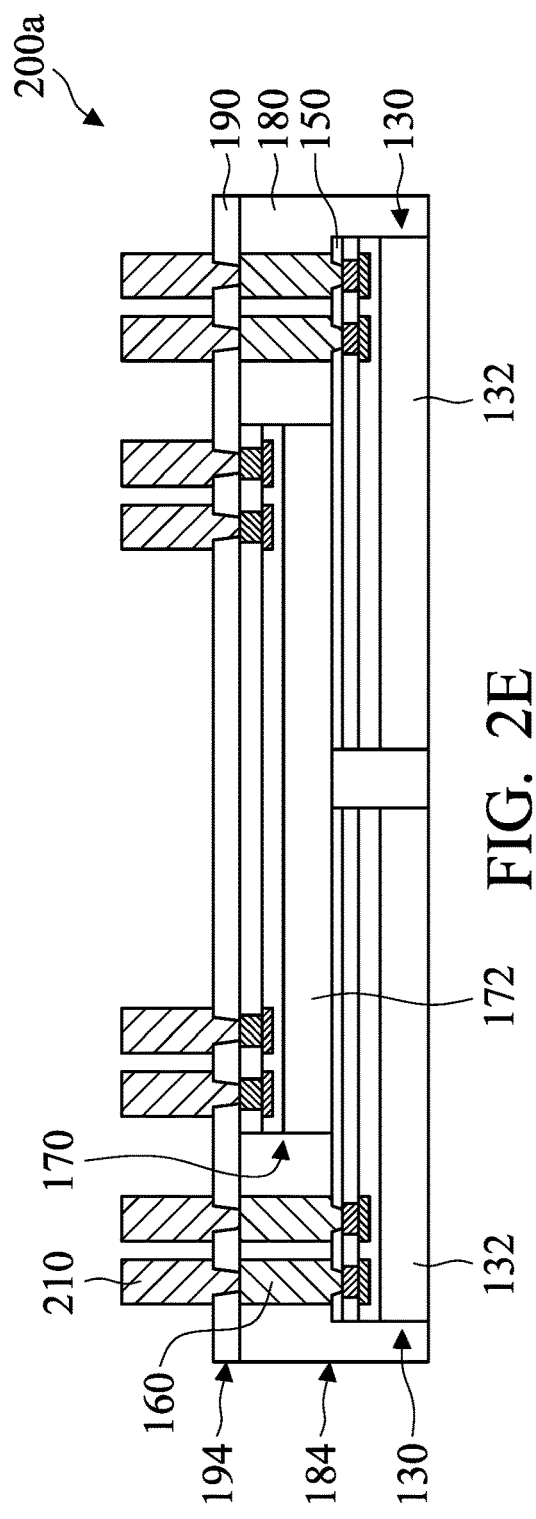
Figure 2F:
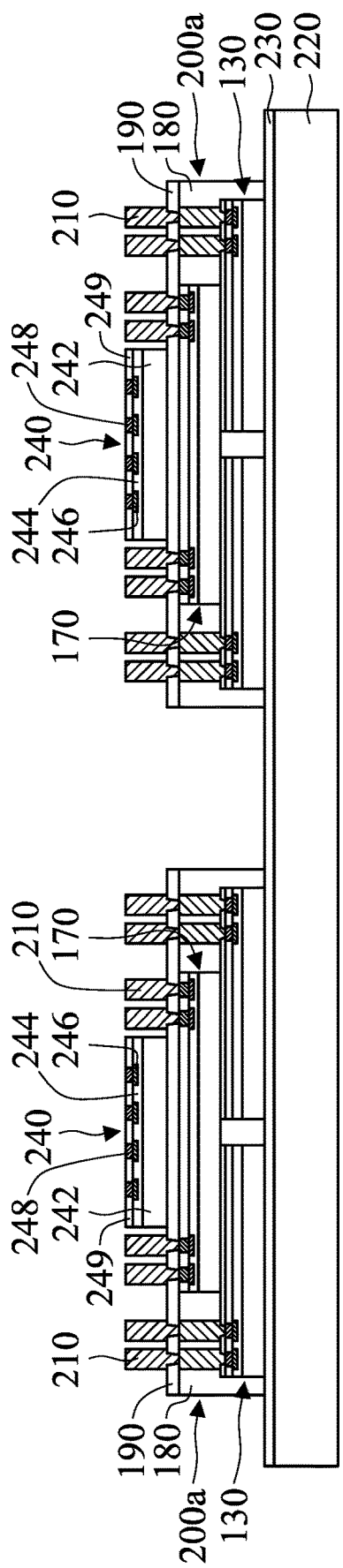
Figure 2G:
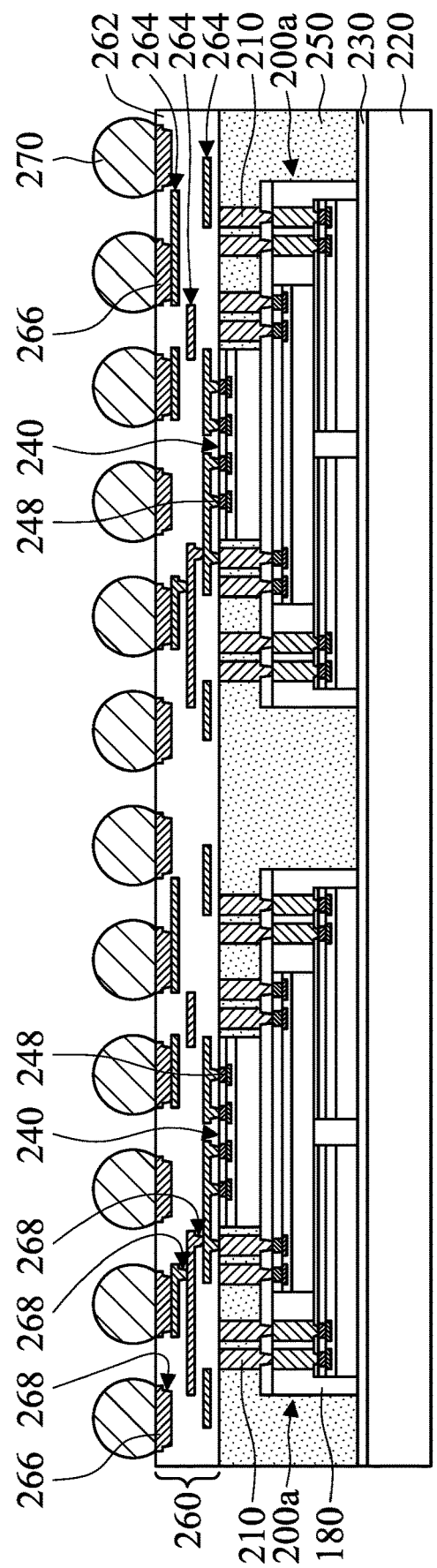
Figure 2H:
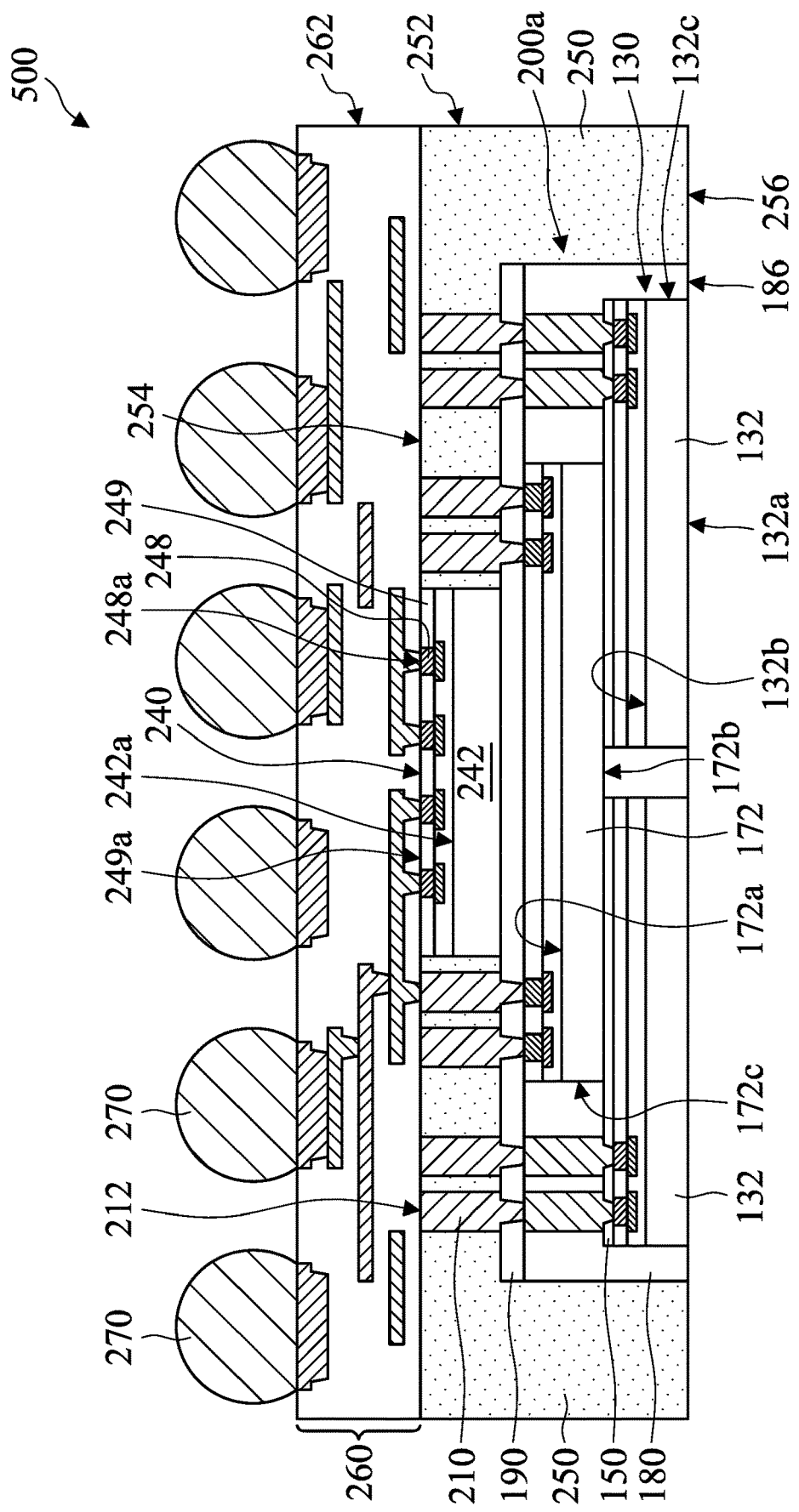
Figures 1, 2H:
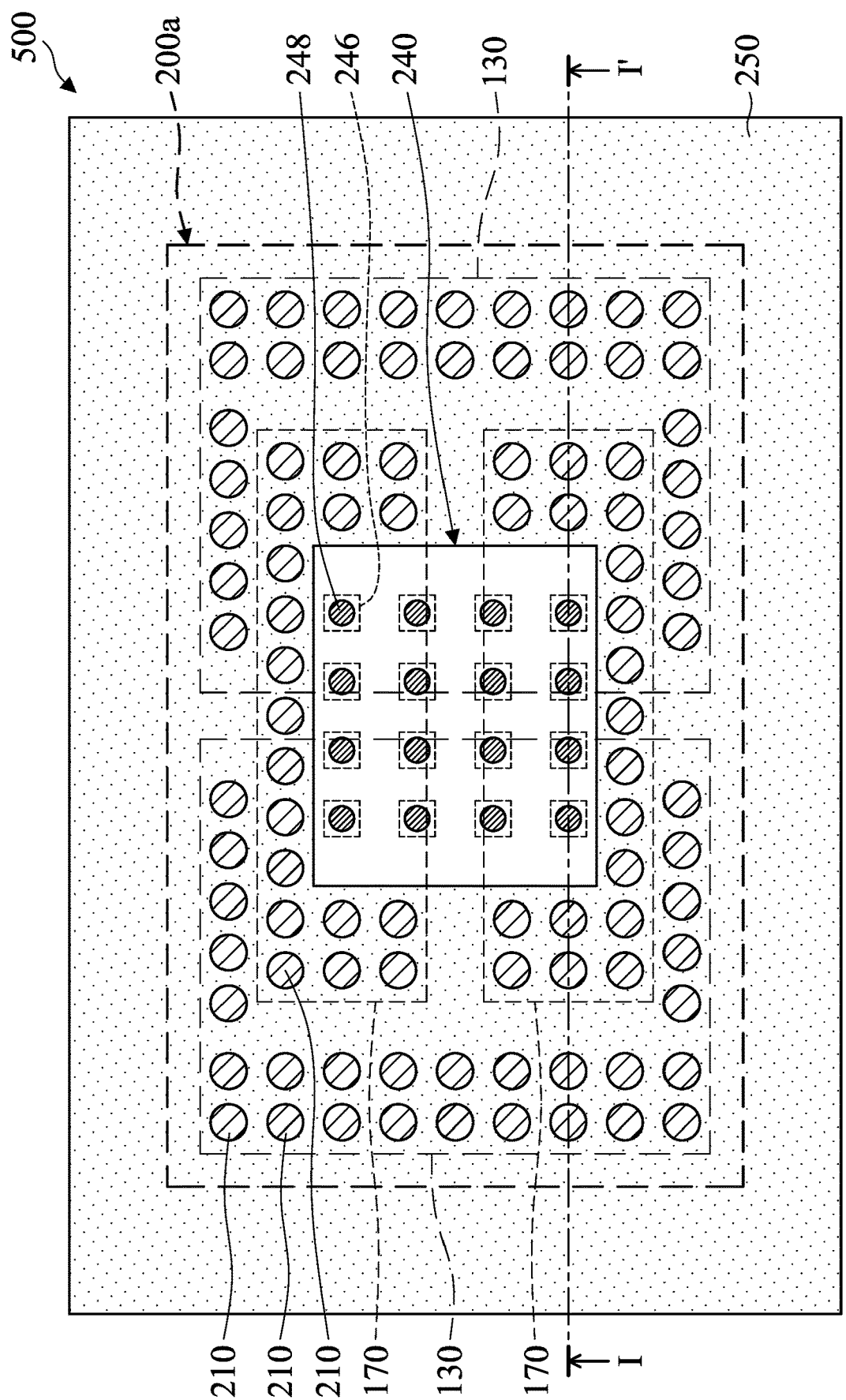

FIGS. 2A-2H are cross-sectional views of various stages of a process for forming a chip package structure, in accordance with some embodiments. FIGS. 2B-1 and 2H-1 are top views of the chip package structure of FIGS. 2B and 2H, in accordance with some embodiments. FIG. 2B is a cross-sectional view illustrating the package 400 along a sectional line I-I' in FIG. 2B-1, in accordance with some embodiments.

FIG. 2H is a cross-sectional view illustrating the chip package structure 500 along a sectional line I-I' in FIG. 2H-1, in accordance with some embodiments. It should be noted that the elements in FIGS. 2A-2H, which are named and labeled identically to those in FIGS. 1A-1H, have the materials similar thereto. Therefore, detailed descriptions are not repeated herein.

As shown in FIG. 2A, a carrier substrate 110 is provided, in accordance with some embodiments. The carrier substrate 110 is configured to provide temporary mechanical and structural support during subsequent processing steps, in accordance with some embodiments. As shown in FIG. 2A, an adhesive layer 120 is formed over the carrier substrate 110, in accordance with some embodiments. The adhesive layer 120 is formed using a lamination process, a spin coating process, or another suitable process.

As shown in FIG. 2A, chip structures 130 are provided over the adhesive layer 120, in accordance with some embodiments. Each of the chip structures 130 includes a chip 132, a dielectric layer 134, bonding pads 136, interconnection structures 138, and a passivation layer 139, in accordance with some embodiments. The dielectric layer 134 is formed over the chip 132, in accordance with some embodiments.

The bonding pads 136 are formed in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments.

As shown in FIG. 2A, insulating layers 150 are formed over the chip structures 130, respectively, in accordance with some embodiments. Each of the insulating layers 150 has holes 152 over the interconnection structures 138 of the chip structure 130 thereunder, in accordance with some embodiments. The holes 152 respectively expose the interconnection structures 138 thereunder, in accordance with some embodiments.

As shown in FIG. 2A, conductive pillars 160 are formed in and over the holes 152 to be electrically connected to the interconnection structures 138, respectively, in accordance with some embodiments. The conductive pillars 160 include copper or another suitable conductive material.

As shown in FIGS. 2B and 2B-1, chip structures 170 are provided over the insulating layers 150, in accordance with some embodiments. The chip structures 170 are positioned over the chip structures 130, in accordance with some embodiments. The insulating layers 150 separate the chip structures 130 from the chip structures 170, in accordance with some embodiments.

In some embodiments, a portion of each of the chip structures 130 is exposed by the chip structures 170. The chip structures 170 are between the conductive pillars 160, in accordance with some embodiments. The conductive pillars 160 surround the chip structures 170, in accordance with some embodiments.

Each of the chip structures 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The bonding pads 176 are formed in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

As shown in FIG. 2C, a molding layer 180 is formed over the adhesive layer 120, in accordance with some embodiments. The molding layer 180 surrounds the chip structures 130 and 170 and the conductive pillars 160, in accordance with some embodiments. The molding layer 180 covers the chip structures 130, in accordance with some embodiments. In some embodiments, portions of the molding layer 180 are between the chip structures 130 and 170 and the conductive pillars 160. The molding layer 180 includes a polymer material or another suitable insulating material.

The molding layer 180 and the carrier substrate 110 are made of different materials, in accordance with some embodiments. For eliminating or reducing the warpage of the package 400, the coefficient of thermal expansion of the material of the carrier substrate 110 is less than the coefficient of thermal expansion of the material of the molding layer 180, in accordance with some embodiments.

The formation of the molding layer 180 includes forming a molding compound material layer over the adhesive layer 120; performing a curing process to cross-link (or thermoset) the polymers of the molding compound material layer; performing a grinding process over the molding compound material layer until the conductive pillars 160 and the interconnection structures 178 are exposed, in accordance with some embodiments.

Therefore, top surfaces 178a, 170a, 162, and 182 of the interconnection structures 178, the chip structures 170, the conductive pillars 160, and the molding layer 180 are substantially coplanar, in accordance with some embodiments. The conductive pillars 160 pass through the molding layer 180, in accordance with some embodiments.

As shown in FIG. 2D, an insulating layer 190 is formed over the molding layer 180 and the chip structures 170, in accordance with some embodiments. The insulating layer 190 has holes 192 over the conductive pillars 160 and the interconnection structures 178, in accordance with some embodiments.

The holes 192 respectively expose the conductive pillars 160 thereunder and the interconnection structures 178 thereunder, in accordance with some embodiments. As shown in FIG. 2D, conductive pillars 210 are formed in and over the holes 192 to be electrically connected to the conductive pillars 160 and the interconnection structures 178, respectively, in accordance with some embodiments.

As shown in FIG. 2E, the chip structures 130 and the molding layer 180 are debonded from the carrier substrate 110, in accordance with some embodiments. The debonding process includes performing a thermal process over the adhesive layer 120, in accordance with some embodiments. For example, the adhesive layer 120 is irradiated with UV light to weaken the adhesive properties of the adhesive layer 120.

As shown in FIG. 2E, a sawing process is performed over the insulating layer 190 and the molding layer 180 to form individual chip package structures 200a, in accordance with some embodiments. Each of the chip package structures 200a includes the chip structures 130, the conductive pillars 160, the chip structures 170, the molding layer 180, the insulating layer 190, and the conductive pillars 210, in accordance with some embodiments. In each of the chip package structures 200a, side walls 194 and 184 of the insulating layer 190 and the molding layer 180 are substantially coplanar, in accordance with some embodiments.

As shown in FIG. 2F, a carrier substrate 220 is provided, in accordance with some embodiments. The carrier substrate 220 is configured to provide temporary mechanical and structural support during subsequent processing steps, in accordance with some embodiments. As shown in FIG. 2F, an adhesive layer 230 is formed over the carrier substrate 220, in accordance with some embodiments.

As shown in FIG. 2F, the chip package structures 200a are disposed over the adhesive layer 230, in accordance with some embodiments. As shown in FIG. 2F, chip structures 240 are provided over the chip package structures 200a, respectively, in accordance with some embodiments.

The chip structure 240 is over the chip structures 170 and the molding layer 180 of one of the chip package structures 200a, in accordance with some embodiments. The insulating layer 190 separates the chip structures 170 thereunder from the chip structure 240 thereover, in accordance with some embodiments.

Each of the chip structures 240 includes a chip 242, a dielectric layer 244, bonding pads 246, interconnection structures 248, and a passivation layer 249, in accordance with some embodiments. The dielectric layer 244 is formed over the chip 242, in accordance with some embodiments. The bonding pads 246 are formed in the dielectric layer 244, in accordance with some embodiments. The bonding pads 246 are electrically connected to devices (not shown) formed in/over the chip 242, in accordance with some embodiments.

The interconnection structures 248 are formed over the bonding pads 246 respectively, in accordance with some embodiments. The interconnection structures 248 include conductive pillars or conductive bumps, in accordance with some embodiments. The passivation layer 249 is formed over the dielectric layer 244 and surrounds the interconnection structures 248, in accordance with some embodiments.

As shown in FIG. 2G, a molding layer 250 is formed over the adhesive layer 230 and the chip package structures 200a, in accordance with some embodiments. The molding layer 250 surrounds the chip package structures 200a and the chip structures 240, in accordance with some embodiments.

The molding layer 250 includes a polymer material or another suitable insulating material. In some embodiments, the molding layers 180 and 250 are made of different materials. In some other embodiments, the molding layers 180 and 250 are made of the same material.

The molding layer 250 and the carrier substrate 220 are made of different materials, in accordance with some embodiments. For eliminating or reducing the warpage of the package of FIG. 2G, the coefficient of thermal expansion of the material of the carrier substrate 220 is less than the coefficient of thermal expansion of the material of the molding layer 250, in accordance with some embodiments.

As shown in FIG. 2G, a wiring structure 260 is formed over the molding layer 250, the chip structures 240, and the chip package structures 200a, in accordance with some embodiments. The wiring structure 260 includes a dielectric layer 262, wiring layers 264, conductive pads 266, and conductive vias 268, in accordance with some embodiments. The wiring layers 264 and conductive vias 268 are in the dielectric layer 262, in accordance with some embodiments. The conductive pads 266 are over the dielectric layer 262, in accordance with some embodiments.

The conductive vias 268 are between the conductive pads 266, the wiring layers 264, the conductive pillars 210, and the interconnection structures 248, in accordance with some embodiments. Therefore, the conductive pads 266, the wiring layers 264, the conductive pillars 210, and the interconnection structures 248 are able to be electrically connected to each other through the conductive vias 268 according to design requirements, in accordance with some embodiments.

As shown in FIG. 2G, conductive bumps 270 are formed over the conductive pads 266, respectively, in accordance with some embodiments. The conductive bumps 270 include tin (Sn) or another suitable conductive material. The formation of the conductive bumps 270 includes forming a solder paste over the conductive pads 266 and reflowing the solder paste, in accordance with some embodiments.

As shown in FIGS. 2H and 2H-1, the chip package structures 200a and the molding layer 250 are debonded from the carrier substrate 220, in accordance with some embodiments. The debonding process includes performing a thermal process over the adhesive layer 230, in accordance with some embodiments. For example, the adhesive layer 230 is irradiated with UV light to weaken the adhesive properties of the adhesive layer 230.

As shown in FIGS. 2H and 2H-1, a sawing process is performed over the wiring structure 260 and the molding layer 250 to form individual chip package structures 500, in accordance with some embodiments. For the sake of simplicity, the conductive bumps 270 and the wiring structure 260 are omitted in FIG. 2H-1, in accordance with some embodiments.

Each of the chip package structures 500 includes the chip package structure 200a, the chip structure 240, the molding layer 250, the wiring structure 260, and the conductive bumps 270, in accordance with some embodiments. In the chip package structure 500, side walls 262 and 252 of the wiring structure 260 and the molding layer 250 are substantially coplanar, in accordance with some embodiments.

In the chip package structure 500, top surfaces 212, 254, 249a, and 248a of the conductive pillars 210, the molding layer 250, the passivation layer 249, and the interconnection structures 248 are substantially coplanar, in accordance with some embodiments. The conductive pillars 210 pass through the molding layer 250, in accordance with some embodiments. The molding layer 250 continuously surrounds the entire chip package structures 200a and the entire chip structure 240, in accordance with some embodiments. The molding layer 180 is a single layer structure, in accordance with some embodiments.

In some embodiments, a bottom surface 132a of the chip 132, a bottom surface 186 of the molding layer 180, and a bottom surface 256 of the molding layer 250 are substantially coplanar. The molding layer 250 surrounds the insulating layers 190 and 150, in accordance with some embodiments. The molding layer 180 covers side walls 132c and top surfaces 132b of the chips 132 and side walls 172c and bottom surfaces 172b of the chips 172, in accordance with some embodiments.

The molding layer 180 covers top surfaces 132b of the chips 132 but does not cover top surfaces 172a of the chips 172, in accordance with some embodiments. The molding layer 250 does not cover a top surface 242a of the chip 242, in accordance with some embodiments. The molding layer 180 does not cover the bottom surfaces 132a of the chips 132, in accordance with some embodiments. The molding layer 250 does not cover the bottom surfaces 132a and 186 of the chips 132 and the molding layer 180, in accordance with some embodiments. The chip package structure 500 is a fan-out chip package structure, in accordance with some embodiments.

Figure 3A:
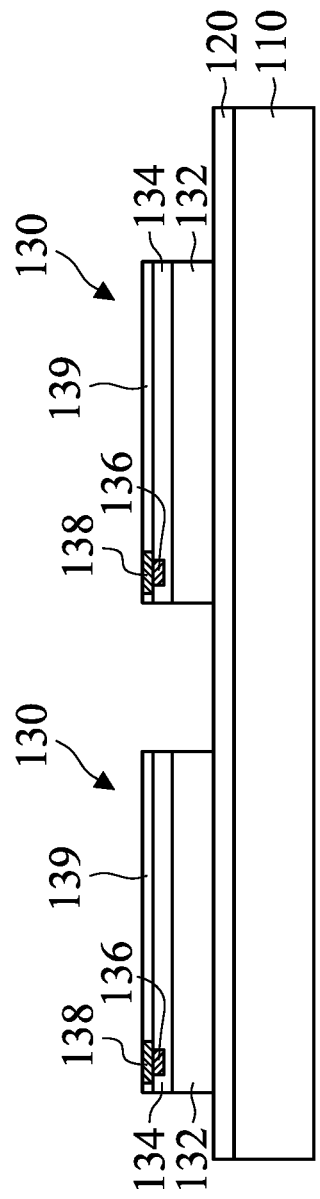

FIGS. 3A-3E are cross-sectional views of various stages of a process for forming a chip package structure, in accordance with some embodiments. As shown in FIG. 3A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, a combination thereof, and/or the like, in accordance with some embodiments. The carrier substrate 110 includes a wafer, in accordance with some embodiments.

As shown in FIG. 3A, an adhesive layer 120 is formed over the carrier substrate 110, in accordance with some embodiments. The adhesive layer 120 includes any suitable adhesive material, such as a polymer material, in accordance with some embodiments. For example, the adhesive layer 120 includes an ultraviolet (UV) glue, which loses its adhesive properties when exposed to UV light, in accordance with some embodiments. In some embodiments, the adhesive layer 120 includes a double sided adhesive tape. The adhesive layer 120 is formed using a lamination process, a spin coating process, or another suitable process.

As shown in FIG. 3A, chip structures 130 are provided over the adhesive layer 120, in accordance with some embodiments. The chip structures 130 include memory chips, in accordance with some embodiments. Each of the chip structures 130 includes a chip 132, a dielectric layer 134, bonding pads 136, interconnection structures 138, and a passivation layer 139, in accordance with some embodiments.

The chip 132 includes, for example, a semiconductor substrate. In some embodiments, the chip 132 is made of an elementary semiconductor material including silicon or germanium in a single crystal, polycrystal, or amorphous structure. In some other embodiments, the chip 132 is made of a compound semiconductor, such as silicon carbide, gallium arsenide, gallium phosphide, indium phosphide, indium arsenide, an alloy semiconductor, such as SiGe, or GaAsP, or a combination thereof. The chip 132 may also include multi-layer semiconductors, semiconductor on insulator (SOI) (such as silicon on insulator or germanium on insulator), or a combination thereof.

In some embodiments, the chip 132 includes various device elements. In some embodiments, the various device elements are formed in and/or over the chip 132. The device elements are not shown in figures for the purpose of simplicity and clarity. Examples of the various devices elements include active devices, passive devices, other suitable devices, or a combination thereof. The active devices may include transistors or diodes (not shown). The passive devices include resistors, capacitors, or other suitable passive devices.

For example, the transistors include metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the chip 132. The isolation features are used to define active regions and electrically isolate various device elements formed in and/or over the chip 132 in the active regions. In some embodiments, the isolation features include shallow trench isolation (STI) features, local oxidation of silicon (LOCOS) features, other suitable isolation features, or a combination thereof.

The dielectric layer 134 is formed over the chip 132, in accordance with some embodiments. The dielectric layer 134 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 134 is formed using a CVD process, a HDPCVD process, a spin-on process, a sputtering process, or a combination thereof, in accordance with some embodiments.

The bonding pads 136 are formed in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments. The bonding pads 136 and the interconnection structures 138 are made of aluminum, tungsten, copper or another suitable conductive material, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments. The passivation layer 139 includes a polymer material or another suitable insulating material.

Figure 3B:
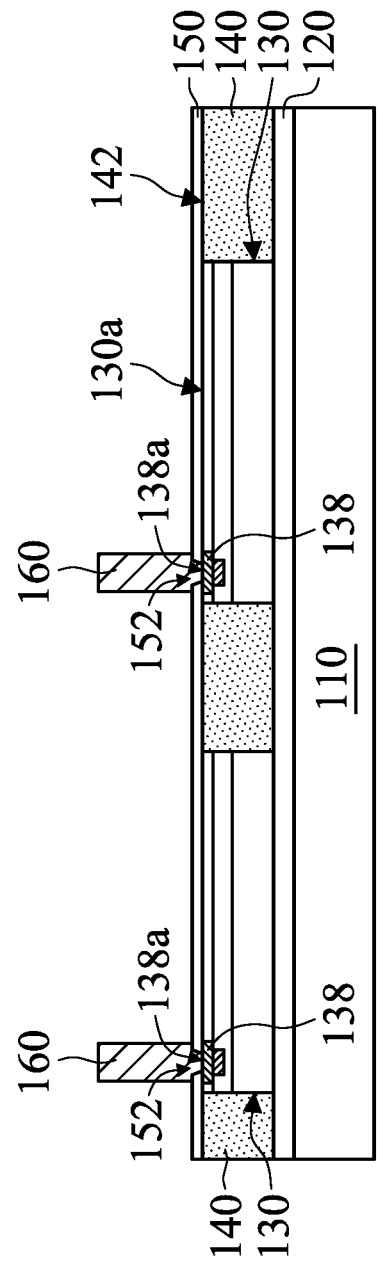

As shown in FIG. 3B, a molding layer 140 is formed over the carrier substrate 110 and the adhesive layer 120, in accordance with some embodiments. The molding layer 140 surrounds the chip structures 130, in accordance with some embodiments. In some embodiments, portions of the molding layer 140 are located between the chip structures 130. The molding layer 140 includes a polymer material or another suitable insulating material. The polymer material includes thermosetting polymers, thermoplastic polymers, or mixtures thereof. The polymer material includes, for example, plastic materials, epoxy resin, polyimide, polyethylene terephthalate (PET), polyvinyl chloride (PVC), polymethylmethacrylate (PMMA), polymer components doped with fillers including fiber, clay, silica, glass, ceramic, inorganic particles, or combinations thereof. The carrier substrate 110 and the molding layer 140 are made of different materials, in accordance with some embodiments.

The formation of the molding layer 140 includes forming a molding compound material layer over the adhesive layer 120; performing a curing process to cross-link (or thermoset) the polymers of the molding compound material layer; and performing a grinding process over the molding compound material layer until the interconnection structures 138 are exposed, in accordance with some embodiments. Therefore, top surfaces 138a, 130a, and 142 of the interconnection structures 138, the chip structures 130, and the molding layer 140 are substantially coplanar, in accordance with some embodiments.

As shown in FIG. 3B, an insulating layer 150 is formed over the molding layer 140 and the chip structures 130, in accordance with some embodiments. The insulating layer 150 is a continuous layer, in accordance with some embodiments. The insulating layer 150 has holes 152 over the interconnection structures 138, in accordance with some embodiments. The holes 152 respectively expose the interconnection structures 138 thereunder, in accordance with some embodiments.

The insulating layer 150 and the molding layer 140 are made of different materials, in accordance with some embodiments. The insulating layer 150 is made of a polymer material such as a photoresist material, in accordance with some embodiments. The photoresist material includes a positive type photoresist material and/or a negative type photoresist material, in accordance with some embodiments. The positive type photoresist material includes poly (4-t-butoxycarbonyloxystyrene), polymethylmethacrylate (PMMA), tetrafluoroethylene (TFE), ether, ester, acrylic, fluorocarbon, a cyclic aliphatic structure, or another suitable positive type photoresist material. The negative type photoresist material includes acrylate polymer, cyclic olefin polymer, fluoropolymer, silicon polymer, cyano polymer, or another suitable negative type photoresist material.

As shown in FIG. 3B, conductive pillars 160 are formed in and over the holes 152 to be electrically connected to the interconnection structures 138, respectively, in accordance with some embodiments. The conductive pillars 160 include copper or another suitable conductive material. The conductive pillars 160 are formed using a plating process such as an electroplating process, in accordance with some embodiments.

As shown in FIG. 3C, chip structures 170 are provided over the insulating layer 150, in accordance with some embodiments. The chip structures 170 include memory chips, in accordance with some embodiments. The chip structures 170 are positioned over the chip structures 130 and the molding layer 140, in accordance with some embodiments.

In some embodiments, a portion of each of the chip structures 130 is exposed or not covered by the chip structures 170. The chip structures 170 are between the conductive pillars 160, in accordance with some embodiments. Each of the chip structures 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The dielectric layer 174 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 174 is formed using a CVD process, a HDPCVD process, a spin-on process, a sputtering process, or a combination thereof, in accordance with some embodiments.

The bonding pads 176 are formed in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

As shown in FIG. 3D, a molding layer 180 is formed over the insulating layer 150, in accordance with some embodiments. The insulating layer 150 separates the molding layer 140 and the chip structures 130 from the molding layer 180 and the chip structures 170, in accordance with some embodiments. The molding layer 180 is over the chip structures 130 and the molding layer 140, in accordance with some embodiments.

The molding layer 180 surrounds the chip structures 170 and the conductive pillars 160, in accordance with some embodiments. In some embodiments, portions of the molding layer 180 are between the chip structures 170 and the conductive pillars 160.

The molding layer 180 and the insulating layer 150 are made of different materials, in accordance with some embodiments. The molding layer 180 includes a polymer material or another suitable insulating material. The polymer material includes thermosetting polymers, thermoplastic polymers, or mixtures thereof. The polymer material includes, for example, plastic materials, epoxy resin, polyimide, polyethylene terephthalate (PET), polyvinyl chloride (PVC), polymethylmethacrylate (PMMA), polymer components doped with fillers including fiber, clay, silica, glass, ceramic, inorganic particles, or combinations thereof.

The formation of the molding layer 180 includes forming a molding compound material layer over the insulating layer 150; performing a curing process to cross-link (or thermoset) the polymers of the molding compound material layer; performing a grinding process over the molding compound material layer until the conductive pillars 160 and the interconnection structures 178 are exposed, in accordance with some embodiments.

Therefore, top surfaces 178a, 170a, 162, and 182 of the interconnection structures 178, the chip structures 170, the conductive pillars 160, and the molding layer 180 are substantially coplanar, in accordance with some embodiments. The conductive pillars 160 pass through the molding layer 180, in accordance with some embodiments.

Figure 3E:
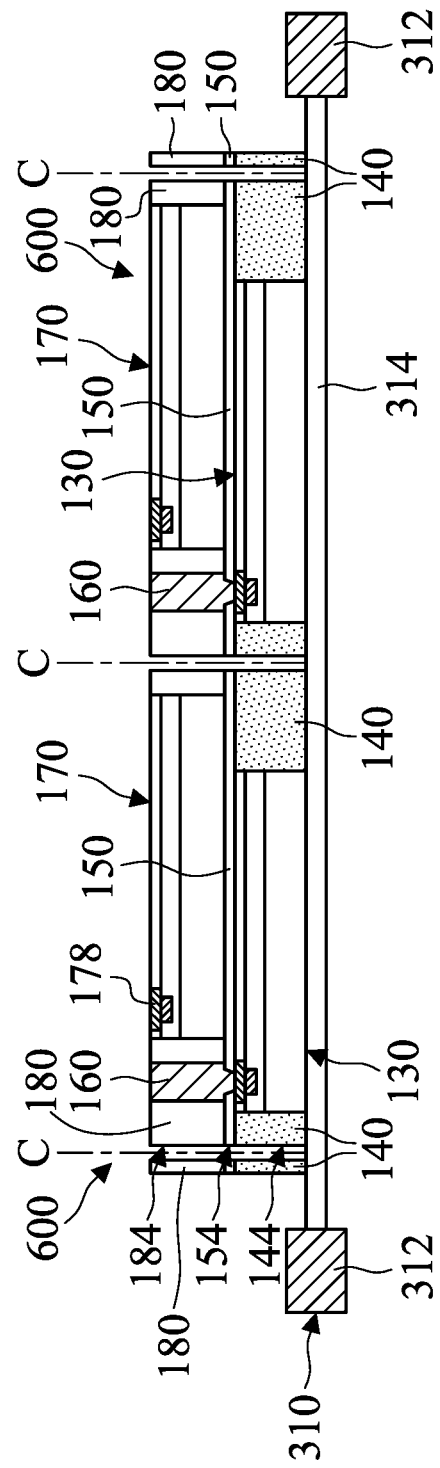

As shown in FIG. 3E, the carrier substrate 110 and the adhesive layer 120 are removed, in accordance with some embodiments. As shown in FIG. 3E, the chip structures 130 and 170 and the molding layers 140 and 180 are disposed over a carrier 310, in accordance with some embodiments. The carrier 310 includes a frame 312 and a support film 314, in accordance with some embodiments. The frame 312 is connected to the support film 314, in accordance with some embodiments.

Thereafter, as shown in FIG. 3E, a cutting process is performed to cut through the molding layer 180, the insulating layer 150, and the molding layer 140 along cutting lines C into chip package units 600, in accordance with some embodiments. Each chip package unit 600 includes at least one chip structure 130, at least one chip structure 170, a molding layer 140, an insulating layer 150, a molding layer 180, and at least one conductive pillar 160, in accordance with some embodiments. In the chip package unit 600, sidewall 184 of the molding layer 180, a sidewall 154 of the insulating layer 150 and a sidewall sidewall 144 of the molding layer 140 are substantially coplanar, in accordance with some embodiments.

FIG. 4A is a top view of the chip package unit 600 of FIG. 3E, in accordance with some embodiments. FIG. 4B is a perspective view of the chip package unit 600 of FIG. 3E, in accordance with some embodiments. For the sake of simplicity, FIG. 4A omits the molding layer 180 and the insulating layer 150, in accordance with some embodiments.

As shown in FIGS. 4A and 4B, in the chip package unit 600, the interconnection structures 178 of the chip structure 170 are arranged along a straight line L1, in accordance with some embodiments. The conductive pillars 160 of the chip package unit 600 are arranged along a straight line L2, in accordance with some embodiments. The straight lines L1 and L2 are substantially parallel to each other, in accordance with some embodiments.

In some embodiments, a distance D1 between the interconnection structure 178 and a sidewall 170b of the chip structure 170 is less than a distance D2 between the interconnection structure 178 and a sidewall 170c of the chip structure 170. In some embodiments, a distance D3 between the conductive pillar 160 and a sidewall 130b of the chip structure 130 is less than a distance D4 between the conductive pillar 160 and a sidewall 130c of the chip structure 130.

Figure 5:
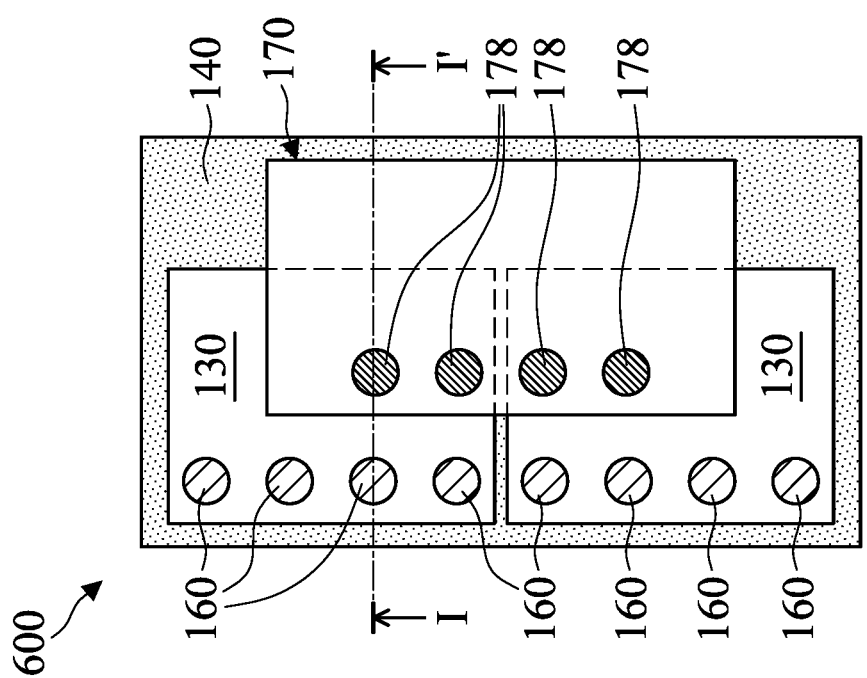
FIG. 5 is a top view of the chip package structure of FIG. 3E, in accordance with some embodiments.

FIG. 5 is a top view of the chip package unit 600 of FIG. 3E, in accordance with some embodiments. For the sake of simplicity, FIG. 5 omits the molding layer 180 and the insulating layer 150, in accordance with some embodiments. In some embodiments, as shown in FIG. 5, the chip package unit 600 includes two chip structures 130 and one chip structure 170. The chip structure 170 partially overlaps the chip structures 130, in accordance with some embodiments.

Figure 6:
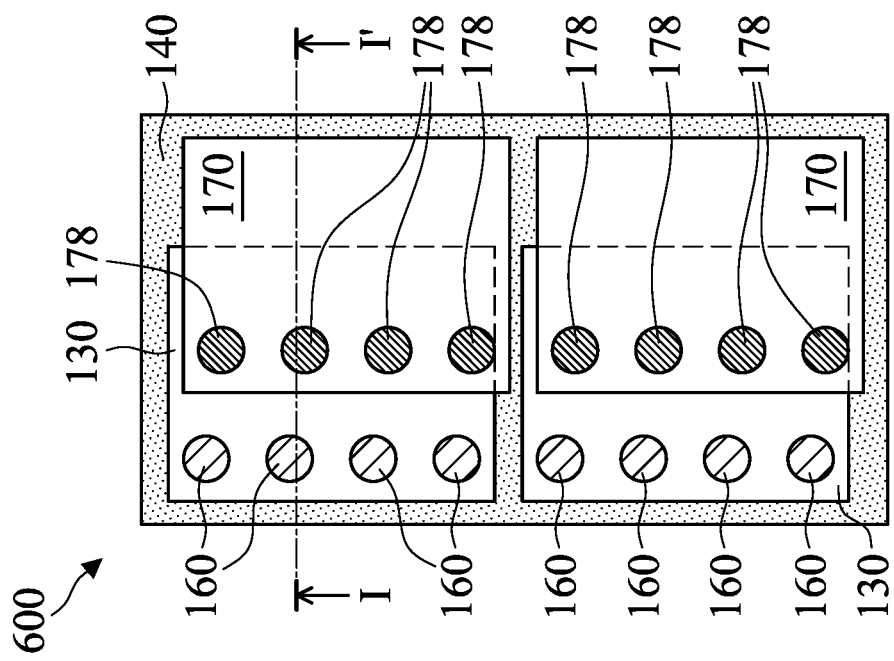
FIG. 6 is a top view of the chip package structure of FIG. 3E, in accordance with some embodiments.

FIG. 6 is a top view of the chip package unit 600 of FIG. 3E, in accordance with some embodiments. For the sake of simplicity, FIG. 6 omits the molding layer 180 and the insulating layer 150, in accordance with some embodiments. In some embodiments, as shown in FIG. 6, the chip package unit 600 includes two chip structures 130 and two chip structures 170. The chip structure 170 partially overlaps the corresponding chip structure 130, in accordance with some embodiments.

Figure 7:
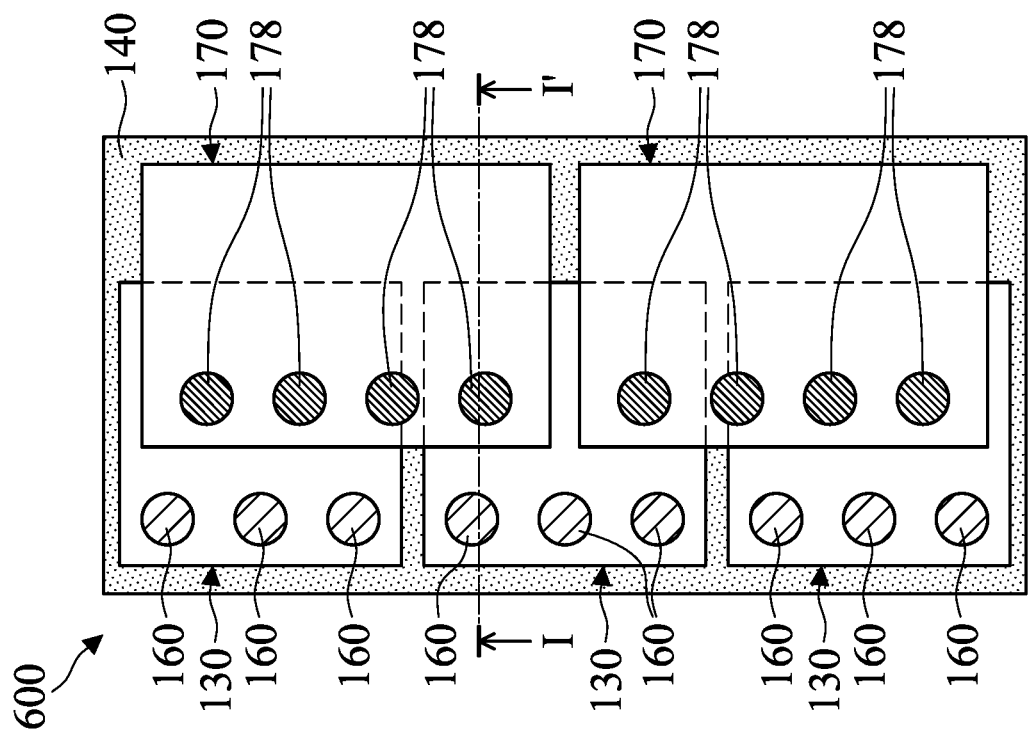
FIG. 7 is a top view of the chip package structure of FIG. 3E, in accordance with some embodiments.

FIG. 7 is a top view of the chip package unit 600 of FIG. 3E, in accordance with some embodiments. For the sake of simplicity, FIG. 7 omits the molding layer 180 and the insulating layer 150, in accordance with some embodiments. In some embodiments, as shown in FIG. 7, the chip package unit 600 includes three chip structures 130 and two chip structures 170. The chip structure 170 partially overlaps the corresponding two chip structures 130, in accordance with some embodiments.

Figure 8:
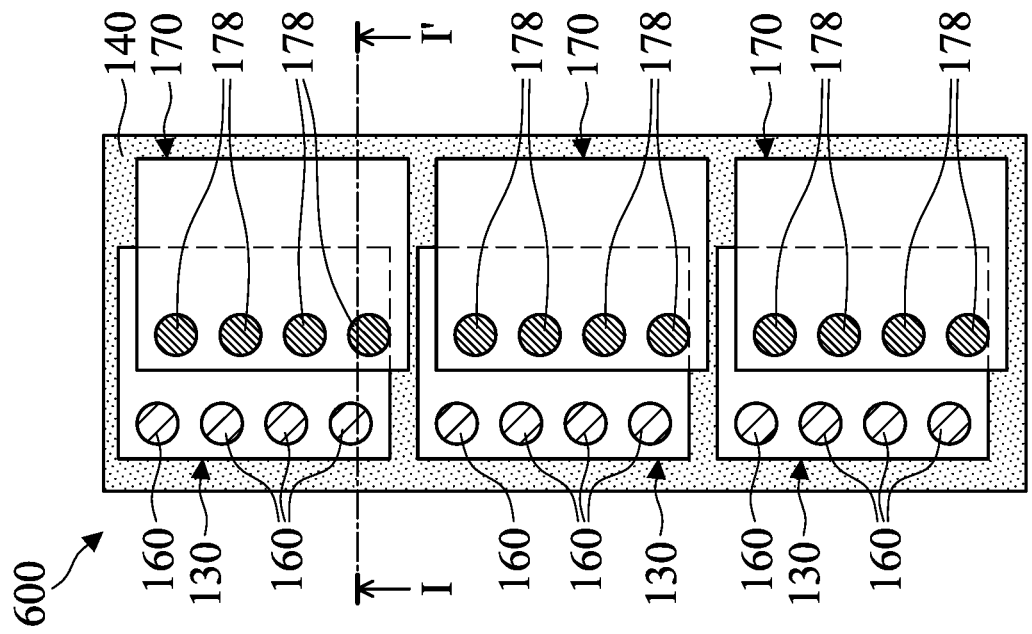
FIG. 8 is a top view of the chip package structure of FIG. 3E, in accordance with some embodiments.

FIG. 8 is a top view of the chip package unit 600 of FIG. 3E, in accordance with some embodiments. For the sake of simplicity, FIG. 8 omits the molding layer 180 and the insulating layer 150, in accordance with some embodiments. In some embodiments, as shown in FIG. 8, the chip package unit 600 includes three chip structures 130 and three chip structures 170. The chip structure 170 partially overlaps the corresponding chip structure 130, in accordance with some embodiments.

Figure 9A:
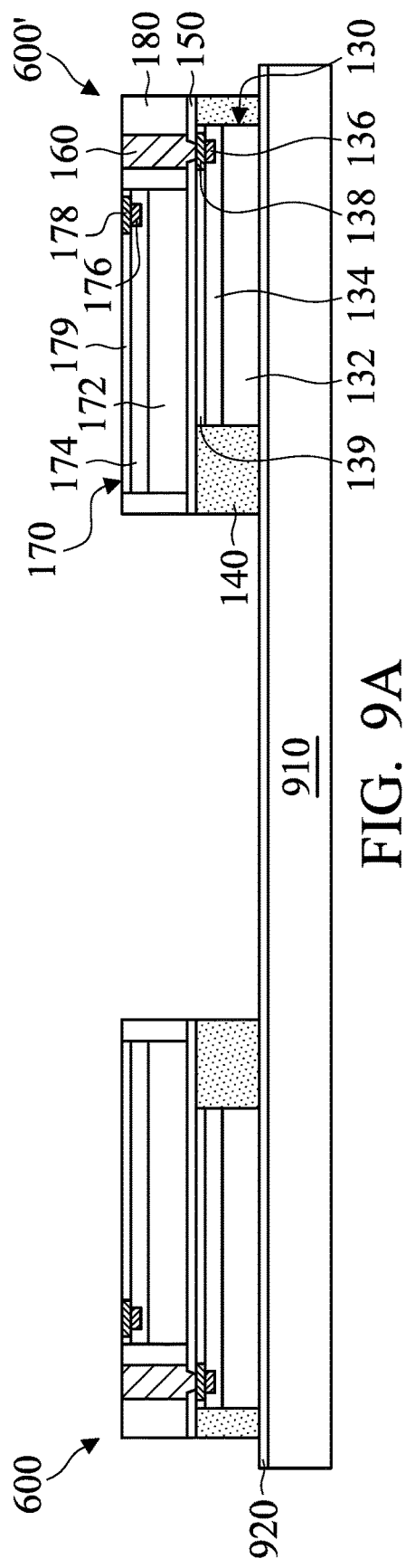
FIGS. 9A-9E are cross-sectional views of various stages of a process for forming a chip package structure, in accordance with some embodiments.

FIGS. 9A-9E are cross-sectional views of various stages of a process for forming a chip package structure, in accordance with some embodiments. As shown in FIG. 9A, a carrier substrate 910 is provided, in accordance with some embodiments. The carrier substrate 910 is configured to provide temporary mechanical and structural support during subsequent processing steps, in accordance with some embodiments. The carrier substrate 910 includes glass, silicon oxide, aluminum oxide, a combination thereof, and/or the like, in accordance with some embodiments. The carrier substrate 910 includes a wafer, in accordance with some embodiments.

As shown in FIG. 9A, an adhesive layer 920 is formed over the carrier substrate 910, in accordance with some embodiments. The adhesive layer 920 includes any suitable adhesive material, such as a polymer material, in accordance with some embodiments. For example, the adhesive layer 920 includes an ultraviolet (UV) glue, which loses its adhesive properties when exposed to UV light, in accordance with some embodiments. In some embodiments, the adhesive layer 920 includes a double sided adhesive tape. The adhesive layer 920 is formed using a lamination process, a spin coating process, or another suitable process.

As shown in FIG. 9A, the chip package units 600 and 600' are disposed over the adhesive layer 920, in accordance with some embodiments. The structures of the chip package units 600 and 600' are similar, except that the chip package unit 600' is (structurally) symmetrical to the chip package unit 600, in accordance with some embodiments.

The chip package unit 600' includes chip structures 130 and 170, molding layers 140 and 180, conductive pillars 160, and an insulating layer 150, in accordance with some embodiments. Each chip structure 130 includes a chip 132, a dielectric layer 134, bonding pads 136, interconnection structures 138, and a passivation layer 139, in accordance with some embodiments. The dielectric layer 134 is formed over the chip 132, in accordance with some embodiments.

The bonding pads 136 are formed in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments. The passivation layer 139 includes a polymer material or another suitable insulating material.

The chip structures 170 are positioned over the chip structures 130, the molding layer 140 and the insulating layer 150, in accordance with some embodiments. In some embodiments, a portion of each chip structure 130 is exposed by the chip structures 170. Each chip structure 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The dielectric layer 174 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 174 is formed using a CVD process, a HDPCVD process, a spin-on process, a sputtering process, or a combination thereof, in accordance with some embodiments.

The bonding pads 176 are formed in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

Figure 9B:
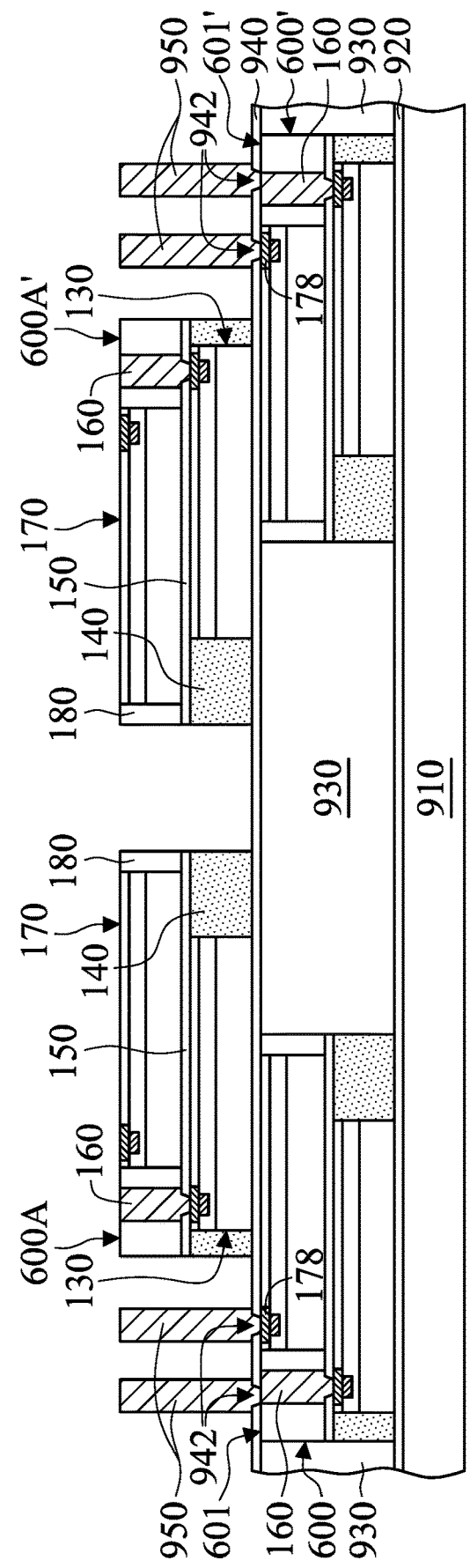

As shown in FIG. 9B, a molding layer 930 is formed over the adhesive layer 920, in accordance with some embodiments. The molding layer 930 surrounds the chip package units 600 and 600', in accordance with some embodiments. The molding layer 930 includes a polymer material or another suitable insulating material. The polymer material includes thermosetting polymers, thermoplastic polymers, or mixtures thereof. The polymer material includes, for example, plastic materials, epoxy resin, polyimide, polyethylene terephthalate (PET), polyvinyl chloride (PVC), polymethylmethacrylate (PMMA), polymer components doped with fillers including fiber, clay, silica, glass, ceramic, inorganic particles, or combinations thereof.

As shown in FIG. 9B, an insulating layer 940 is formed over the molding layer 930 and the chip package units 600 and 600', in accordance with some embodiments. The insulating layer 940 is a continuous layer, in accordance with some embodiments. The insulating layer 940 has holes 942 over the interconnection structures 178 and the conductive pillars 160, in accordance with some embodiments. The holes 942 respectively expose the interconnection structures 178 thereunder and the conductive pillars 160 thereunder, in accordance with some embodiments.

The molding layer 930 is made of a material different from that of the adhesive layer 920 and the insulating layers 150 and 940, in accordance with some embodiments. The insulating layer 940 is made of a polymer material such as a photoresist material, in accordance with some embodiments. The photoresist material includes a positive type photoresist material and/or a negative type photoresist material, in accordance with some embodiments. The positive type photoresist material includes poly (4-t-butoxycarbonyloxy styrene), polymethylmethacrylate (PMMA), tetrafluoroethylene (TFE), ether, ester, acrylic, fluorocarbon, a cyclic aliphatic structure, or another suitable positive type photoresist material. The negative type photoresist material includes acrylate polymer, cyclic olefin polymer, fluoropolymer, silicon polymer, cyano polymer, or another suitable negative type photoresist material.

As shown in FIG. 9B, conductive pillars 950 are formed in and over the holes 942 to be electrically connected to the interconnection structures 178 and the conductive pillars 160 thereunder, in accordance with some embodiments. The conductive pillars 950 include copper or another suitable conductive material.

As shown in FIG. 9B, chip package units 600A and 600A' are disposed over the insulating layer 940, in accordance with some embodiments. Each chip package unit 600A is structurally the same as the chip package unit 600, in accordance with some embodiments. Each chip package unit 600A' is structurally the same as the chip package unit 600', in accordance with some embodiments.

Figure 9C:
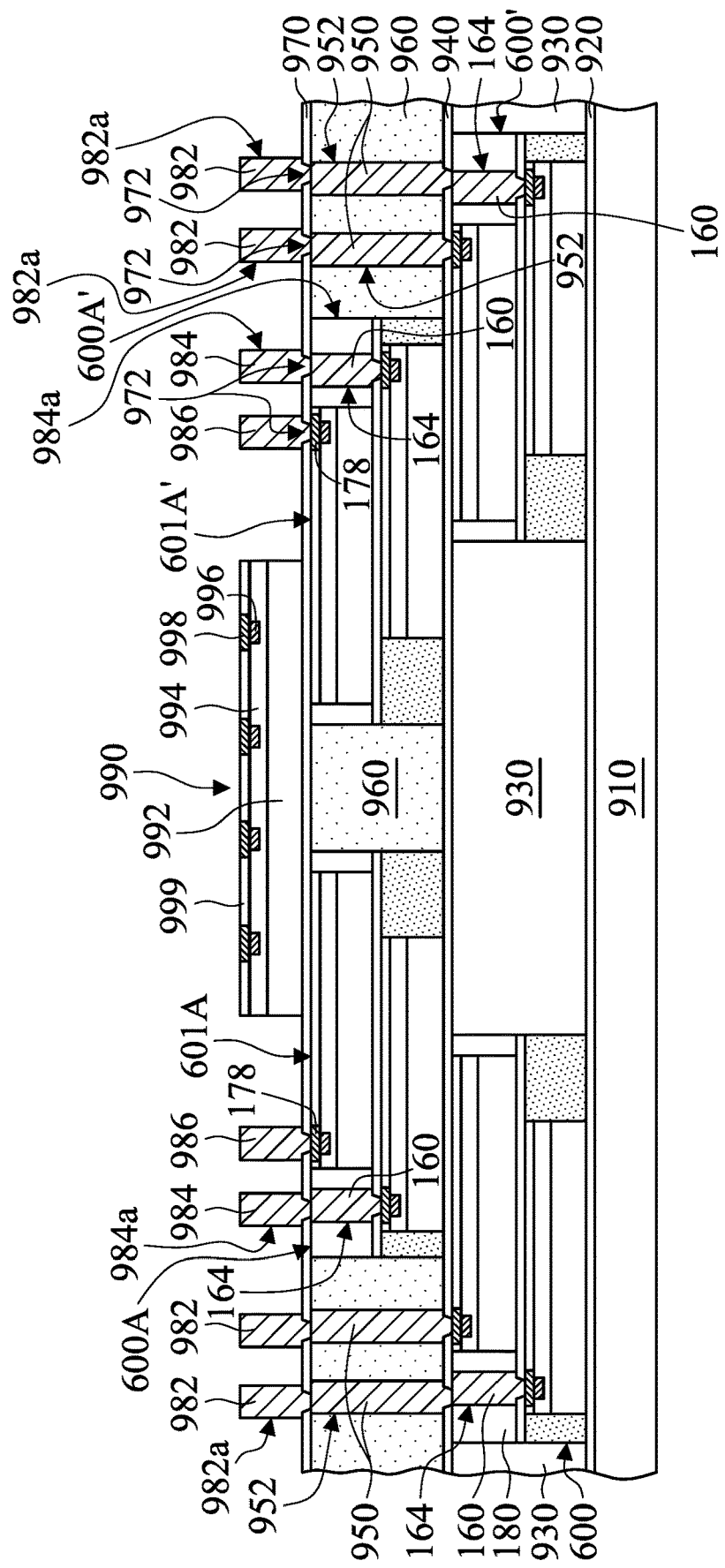
Figures 1, 9C:
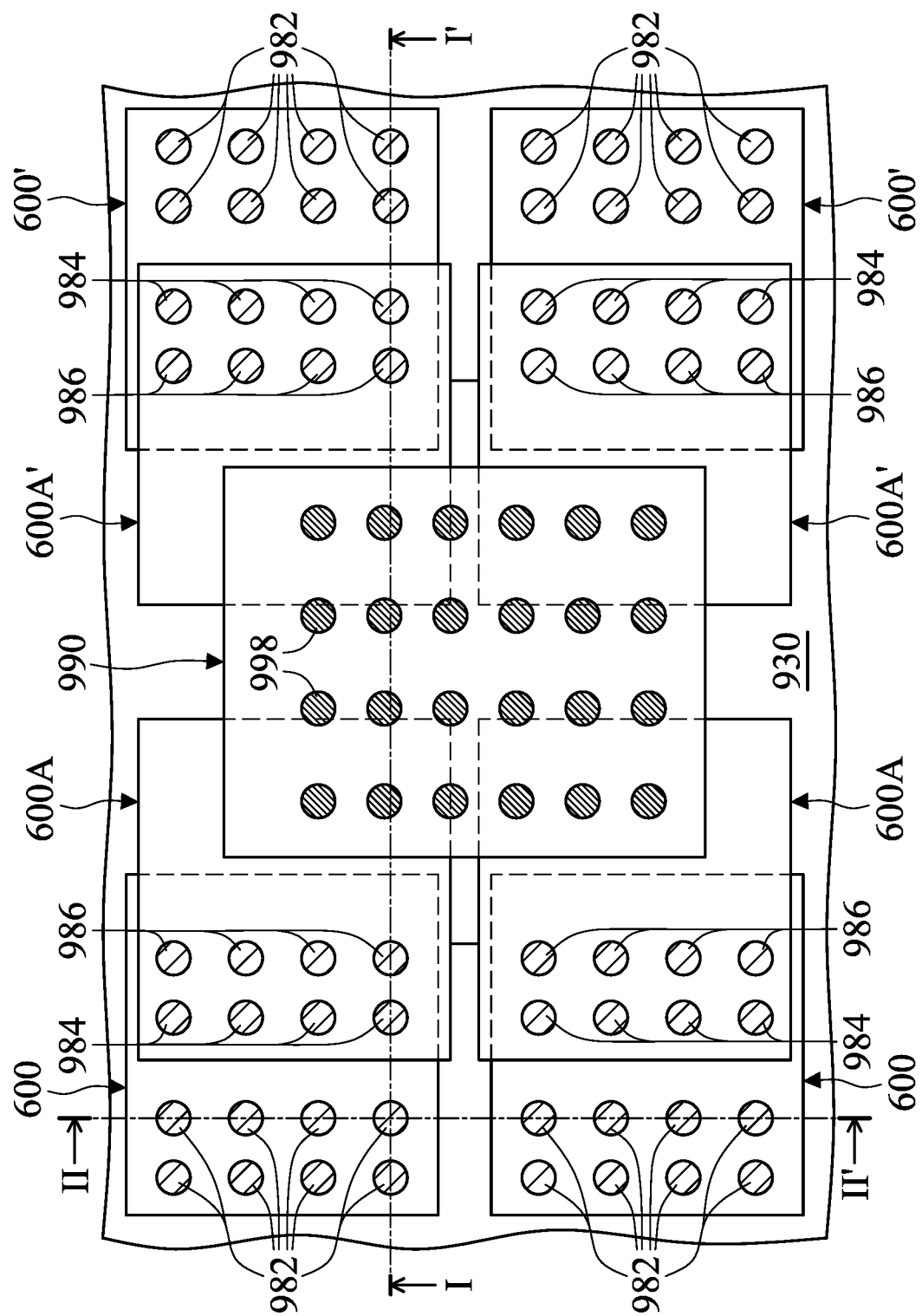
Figures 2, 9C:
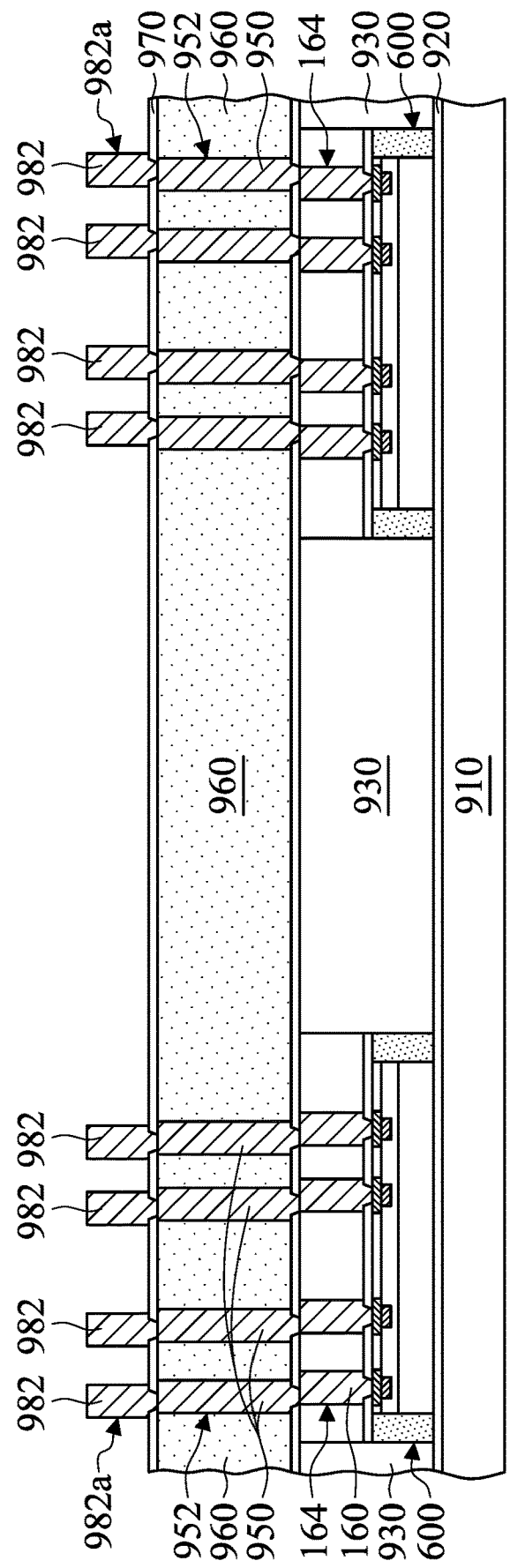

FIG. 9C-1 is a top view of the chip package structure of FIG. 9C, in accordance with some embodiments. FIG. 9C is a cross-sectional view illustrating the chip package structure along a sectional line I-I' in FIG. 9C-1, in accordance with some embodiments. FIG. 9C-2 is a cross-sectional view illustrating the chip package structure along a sectional line II-II' in FIG. 9C-1, in accordance with some embodiments.

As shown in FIGS. 9C, 9C-1 and 9C-2, a molding layer 960 is formed over the insulating layer 940, in accordance with some embodiments. The molding layer 960 surrounds the chip package units 600A and 600A' and the conductive pillars 950, in accordance with some embodiments. The molding layer 960 includes a polymer material or another suitable insulating material. The polymer material includes thermosetting polymers, thermoplastic polymers, or mixtures thereof. The polymer material includes, for example, plastic materials, epoxy resin, polyimide, polyethylene terephthalate (PET), polyvinyl chloride (PVC), polymethylmethacrylate (PMMA), polymer components doped with fillers including fiber, clay, silica, glass, ceramic, inorganic particles, or combinations thereof.

As shown in FIGS. 9C, 9C-1 and 9C-2, an insulating layer 970 is formed over the molding layer 960, the conductive pillars 950, and the chip package units 600A and 600A', in accordance with some embodiments. The insulating layer 970 is a continuous layer, in accordance with some embodiments.

The insulating layer 970 has holes 972 over the interconnection structures 178 and the conductive pillars 160 of the chip package units 600A and 600A' and the conductive pillars 950, in accordance with some embodiments. The holes 972 respectively expose the interconnection structures 178 thereunder, the conductive pillars 160 thereunder and the conductive pillars 950 thereunder, in accordance with some embodiments.

The molding layer 960 is made of a material different from that of the insulating layers 150, 940 and 970, in accordance with some embodiments. The insulating layer 970 is made of a polymer material such as a photoresist material, in accordance with some embodiments. The photoresist material includes a positive type photoresist material and/or a negative type photoresist material, in accordance with some embodiments. The positive type photoresist material includes poly (4-t-butoxycarbonyloxy styrene), polymethylmethacrylate (PMMA), tetrafluoroethylene (TFE), ether, ester, acrylic, fluorocarbon, a cyclic aliphatic structure, or another suitable positive type photoresist material. The negative type photoresist material includes acrylate polymer, cyclic olefin polymer, fluoropolymer, silicon polymer, cyano polymer, or another suitable negative type photoresist material.

As shown in FIGS. 9C, 9C-1 and 9C-2, conductive pillars 982, 984 and 986 are formed in and over the holes 972, in accordance with some embodiments. The conductive pillars 982 are electrically connected to the conductive pillars 950 thereunder, in accordance with some embodiments. The conductive pillars 984 are electrically connected to the conductive pillars 160 thereunder, in accordance with some embodiments. The conductive pillars 986 are electrically connected to the interconnection structures 178 thereunder, in accordance with some embodiments. The conductive pillars 982, 984 and 986 include copper or another suitable conductive material.

As shown in FIGS. 9C, 9C-1 and 9C-2, a chip structure 990 is disposed over the insulating layer 970, in accordance with some embodiments. The chip structure 990 includes a SoC (system on chip) device, in accordance with some embodiments. The chip structure 990 includes a chip 992, a dielectric layer 994, bonding pads 996, interconnection structures 998, and a passivation layer 999, in accordance with some embodiments.

The chip 992 includes, for example, a semiconductor substrate. In some embodiments, the chip 992 is made of an elementary semiconductor material including silicon or germanium in a single crystal, polycrystal, or amorphous structure. In some other embodiments, the chip 992 is made of a compound semiconductor, such as silicon carbide, gallium arsenide, gallium phosphide, indium phosphide, indium arsenide, an alloy semiconductor, such as SiGe, or GaAsP, or a combination thereof. The chip 992 may also include multi-layer semiconductors, semiconductor on insulator (SOI) (such as silicon on insulator or germanium on insulator), or a combination thereof.

In some embodiments, the chip 992 includes various device elements. In some embodiments, the various device elements are formed in and/or over the chip 992. The device elements are not shown in figures for the purpose of simplicity and clarity. Examples of the various devices include active devices, passive devices, other suitable devices, or a combination thereof. The active devices may include transistors or diodes (not shown). The passive devices include resistors, capacitors, or other suitable passive devices.

For example, the transistors include metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the chip 992. The isolation features are used to define active regions and electrically isolate various device elements formed in and/or over the chip 992 in the active regions. In some embodiments, the isolation features include shallow trench isolation (STI) features, local oxidation of silicon (LOCOS) features, other suitable isolation features, or a combination thereof.

The dielectric layer 994 is formed over the chip 992, in accordance with some embodiments. The dielectric layer 994 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 994 is formed using a CVD process, a HDPCVD process, a spin-on process, a sputtering process, or a combination thereof, in accordance with some embodiments.

The bonding pads 996 are formed in the dielectric layer 994, in accordance with some embodiments. The bonding pads 996 are electrically connected to devices (not shown) formed in/over the chip 992, in accordance with some embodiments. The interconnection structures 998 are formed over the respective bonding pads 996, in accordance with some embodiments. The bonding pads 996 and the interconnection structures 998 are made of aluminum, tungsten, copper or another suitable conductive material, in accordance with some embodiments.

The interconnection structures 998 include conductive pillars or conductive bumps, in accordance with some embodiments. The passivation layer 999 is formed over the dielectric layer 994 and surrounds the interconnection structures 998, in accordance with some embodiments.

As shown in FIGS. 9C and 9C-2, a sidewall 164 of the conductive pillar 160 of the chip package unit 600 or 600', a sidewall 952 of the conductive pillar 950 thereover, a sidewall 982a of the conductive pillar 982 thereover are not aligned with each other, in accordance with some embodiments. That is, the sidewalls 164, 952, and 982*a* are not coplanar, in accordance with some embodiments.

A sidewall 164 of the conductive pillar 160 of the chip package unit 600A or 600A' and a sidewall 984*a* of the conductive pillar 984 thereover are not aligned with each other, in accordance with some embodiments. That is, the sidewalls 164 and 984*a* are not coplanar, in accordance with some embodiments.

Since the sidewalls 164, 952, and 982*a* are not coplanar and, the stresses concentrated on the sidewalls 164, 952, and 982*a* are not combined with each other, in accordance with some embodiments. Since the sidewalls 164 and 984*a* are not coplanar and, the stresses concentrated on the sidewalls 164 and 984*a* are not combined with each other, in accordance with some embodiments. Therefore, the reliability of the conductive pillars 160, 950, 982, and 984 is improved, in accordance with some embodiments.

Figure 9D:
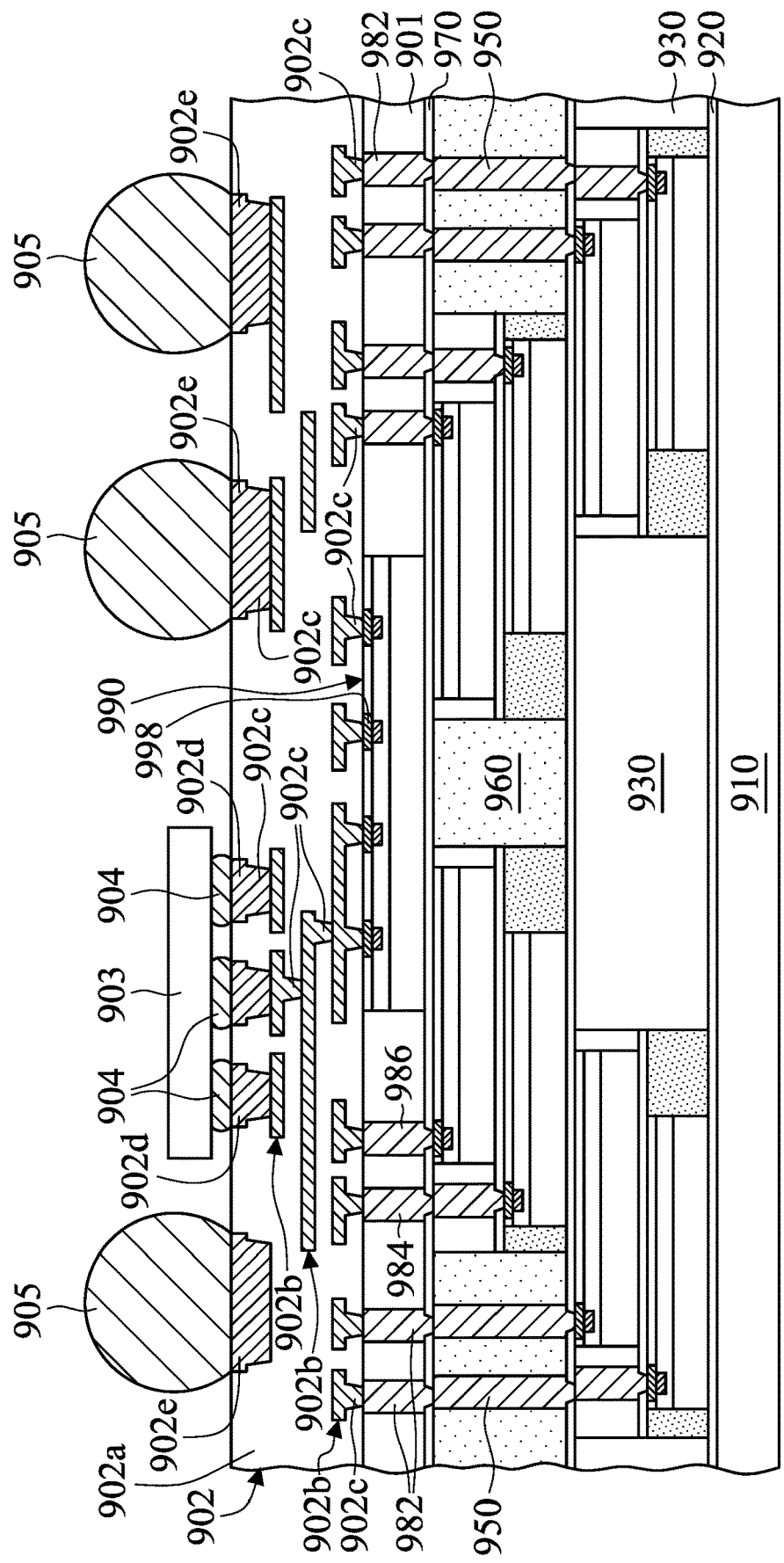

As shown in FIG. 9D, a molding layer 901 is formed over the insulating layer 970, in accordance with some embodiments. The molding layer 901 surrounds the chip structure 990 and the conductive pillars 982, 984 and 986, in accordance with some embodiments. The molding layer 901 includes a polymer material or another suitable insulating material. The polymer material includes thermosetting polymers, thermoplastic polymers, or mixtures thereof. The polymer material includes, for example, plastic materials, epoxy resin, polyimide, polyethylene terephthalate (PET), polyvinyl chloride (PVC), polymethylmethacrylate (PMMA), polymer components doped with fillers including fiber, clay, silica, glass, ceramic, inorganic particles, or combinations thereof. The molding layer 901 and the insulating layer 970 are made of different materials, in accordance with some embodiments.

As shown in FIG. 9D, a wiring structure 902 is formed over the molding layer 901, the chip structure 990, and the conductive pillars 982, 984 and 986, in accordance with some embodiments. The wiring structure 902 includes a dielectric layer 902*a*, wiring layers 902*b*, conductive vias 902*c*, and conductive pads 902*d* and 902*e*, in accordance with some embodiments. The wiring layers 902*b* and conductive vias 902*c* are in the dielectric layer 902*a*, in accordance with some embodiments. The conductive pads 902*d* and 902*e* are over the dielectric layer 902*a*, in accordance with some embodiments.

The conductive vias 902*c* are between the conductive pads 902*d* and 902*e*, the wiring layers 902*b*, the conductive pillars 982, 984 and 986, and the interconnection structures 998, in accordance with some embodiments. Therefore, the conductive pads 902*d* and 902*e*, the wiring layers 902*b*, the conductive pillars 982, 984 and 986, and the interconnection structures 998 are able to be electrically connected to each other through the conductive vias 902*c* according to design requirements, in accordance with some embodiments.

As shown in FIG. 9D, a chip structure 903 is bonded to the conductive pads 902*d* through conductive bumps 904, in accordance with some embodiments. As shown in FIG. 9D, conductive bumps 905 are formed over the conductive pads 902*e*, respectively, in accordance with some embodiments. The conductive bumps 905 include tin (Sn) or another suitable conductive material. The formation of the conductive bumps 905 includes forming a solder paste over the conductive pads 902*e* and reflowing the solder paste, in accordance with some embodiments.

Figure 9E:
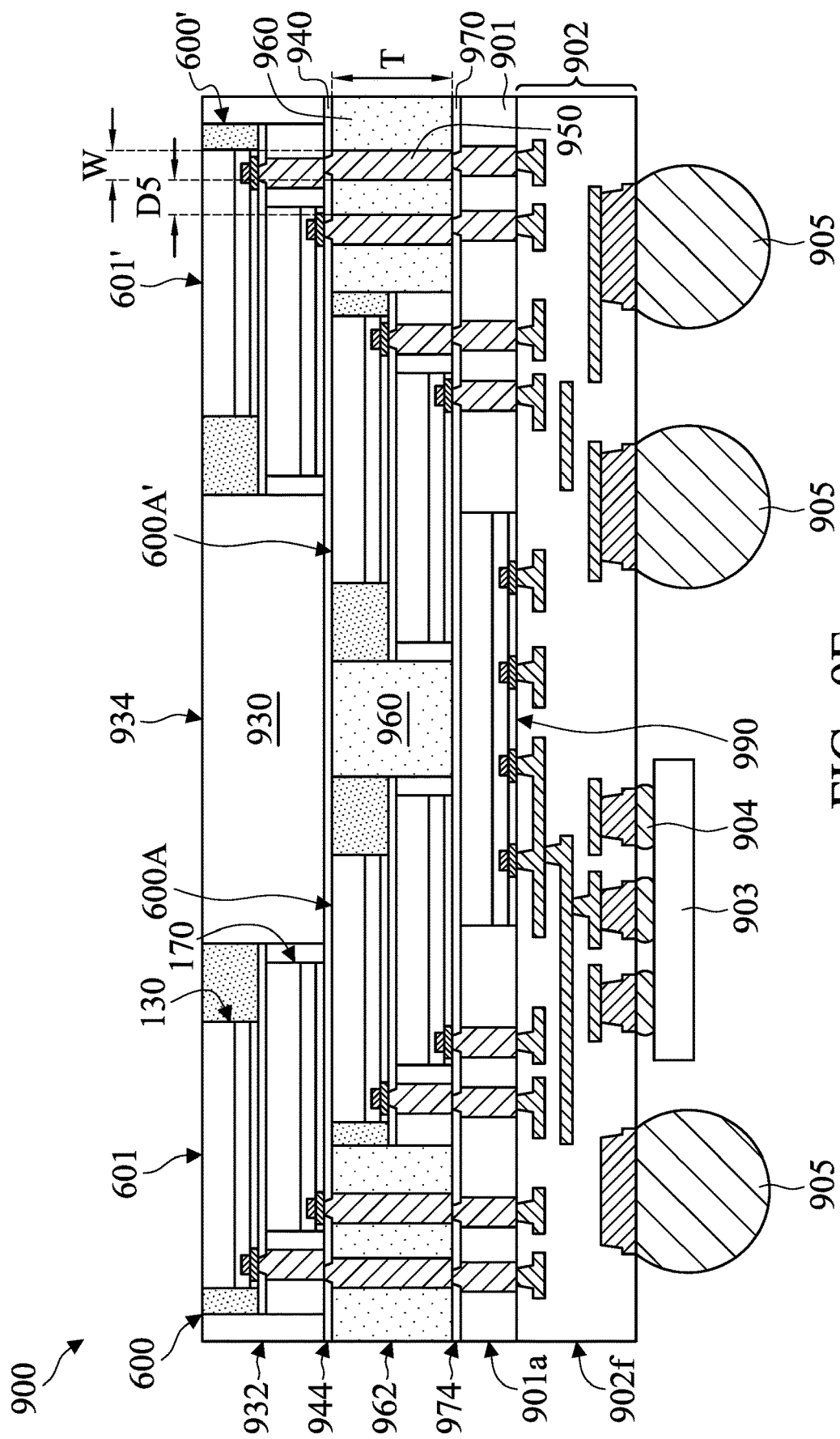

As shown in FIGS. 9D and 9E, the molding layer 930 is debonded from the adhesive layer 920, in accordance with some embodiments. The debonding process includes performing a thermal process over the adhesive layer 920, in accordance with some embodiments. For example, the adhesive layer 920 is irradiated with UV light to weaken the adhesive properties of the adhesive layer 920.

As shown in FIG. 9E, a sawing process is performed over the wiring structure 902, the molding layer 930, 960 and 901, and the insulating layers 940 and 970 to form individual chip package structures 900, in accordance with some embodiments. For the sake of simplicity, FIG. 9E only shows one of the chip package structures 900, in accordance with some embodiments.

Each chip package structure 900 includes the chip package units 600, 600', 600A and 600A', the chip structures 903 and 990, the molding layers 930, 960, and 901, the insulating layers 940 and 970, the wiring structure 902, and the conductive bumps 904 and 905, in accordance with some embodiments.

In some embodiments, sidewalls 902*f*, 901*a*, 974, 962, 944, and 932 of the wiring structure 902, the molding layer 901, the insulating layer 970, the molding layer 960, the insulating layer 940, and the molding layer 930 are substantially coplanar. In some embodiments, top surfaces 601, 934 and 601' of the chip package unit 600, the molding layer 930, and the chip package unit 600' are substantially coplanar.

In some embodiments, a thickness T of the conductive pillar 950 ranges from about 70 nm to about 200 nm. In some embodiments, a width W of the conductive pillar 950 ranges from about 25 nm to about 70 nm. In some embodiments, a distance D5 between the conductive pillars 950 ranges from about 10 nm to about 30 nm. The width W or the distance D5 is less than the thickness T, in accordance with some embodiments. The distance D5 is less than the width W, in accordance with some embodiments.

As mentioned above, the method of forming the chip package structure 900 includes forming chip package units 600, 600', 600A, and 600A' firstly; and then stacking the chip package units 600, 600', 600A, and 600A' over the carrier substrate 910 and performing molding processes over the chip package units 600, 600', 600A, and 600A', in accordance with some embodiments.

The chip package units 600, 600', 600A, and 600A' are pre-stack and modularized units of chip structures 130 and 170, in accordance with some embodiments. The chip package units 600, 600', 600A, and 600A' are used as building blocks in the chip package structure 900, in accordance with some embodiments.

Since the chip package units 600, 600', 600A, and 600A' may be formed in the same process and the chip package structure 900 is formed by stacking the chip package units 600, 600', 600A, and 600A', the production time of the chip package structure 900 is shortened and the production efficiency is improved. Therefore, the cost of the chip package structure 900 is reduced, in accordance with some embodiments.

Furthermore, the chip package units 600, 600', 600A, and 600A' may be used in various chip package structures. The conduction paths between the chip structures 130 and 170 (of the chip package units 600, 600', 600A, and 600A') and the wiring structure 902 are shortest conduction paths (i.e., straight-line conduction paths), which improves the data transmission speed (or the signal transmission speed), the signal integrity and the power integrity, in accordance with some embodiments.

As a result, the wiring parasitics is reduced, in accordance with some embodiments. The latency between the chip structures 130 and 170 and the wiring structure 902 is reduced, in accordance with some embodiments. The bandwidth of the conduction paths from the chip structures 130 and 170 to the wiring structure 902 is enlarged, in accordance with some embodiments.

Since there is no substrate and no underfill layer between the chip package units 600 and 600A, between the chip package units 600' and 600A', and between the chip package units 600A and 600A' and the chip structure 990, the heat dissipation efficiency is improved, in accordance with some embodiments. The molding layers 140, 180, 901, 930 and 960 are made of a material different from that of the insulating layers 150, 940 and 970, in accordance with some embodiments.

Figure 10A:
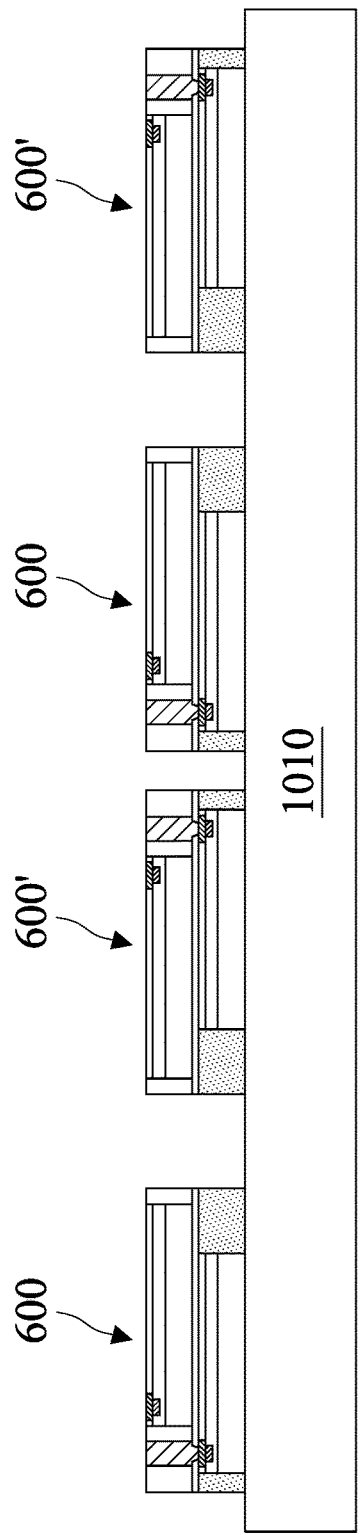
FIGS. 10A-10D are cross-sectional views of various stages of a process for forming a chip package structure, in accordance with some embodiments.

FIGS. 10A-10D are cross-sectional views of various stages of a process for forming a chip package structure, in accordance with some embodiments. As shown in FIG. 10A, chip package units 600 and 600' are disposed over a carrier substrate 1010, in accordance with some embodiments.

The carrier substrate 1010 is configured to provide temporary mechanical and structural support during subsequent processing steps, in accordance with some embodiments. The carrier substrate 1010 includes glass, silicon oxide, aluminum oxide, a combination thereof, and/or the like, in accordance with some embodiments. The carrier substrate 1010 includes a wafer, in accordance with some embodiments.

Figure 10B:
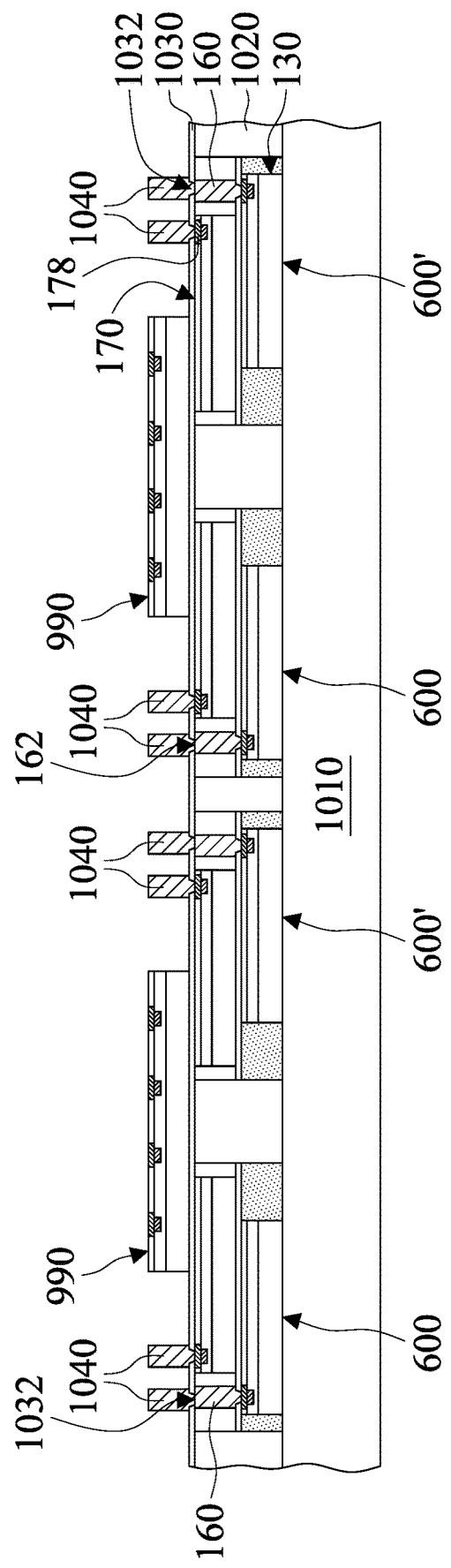

As shown in FIG. 10B, a molding layer 1020 is formed over the carrier substrate 1010, in accordance with some embodiments. The molding layer 1020 surrounds the chip package units 600 and 600', in accordance with some embodiments. The molding layer 1020 includes a polymer material or another suitable insulating material. As shown in FIG. 10B, an insulating layer 1030 is formed over the molding layer 1020 and the chip package units 600 and 600', in accordance with some embodiments.

The insulating layer 1030 is a continuous layer, in accordance with some embodiments. The insulating layer 1030 has holes 1032 over the interconnection structures 178 and the conductive pillars 160, in accordance with some embodiments. The holes 1032 respectively expose the interconnection structures 178 thereunder and the conductive pillars 160 thereunder, in accordance with some embodiments.

As shown in FIG. 10B, conductive pillars 1040 are formed in and over the holes 1032 to be electrically connected to the interconnection structures 178 and the conductive pillars 160 thereunder, in accordance with some embodiments. The conductive pillars 1040 include copper or another suitable conductive material. As shown in FIG. 10B, chip structures 990 are disposed over the insulating layer 1030, in accordance with some embodiments.

Figure 10C:
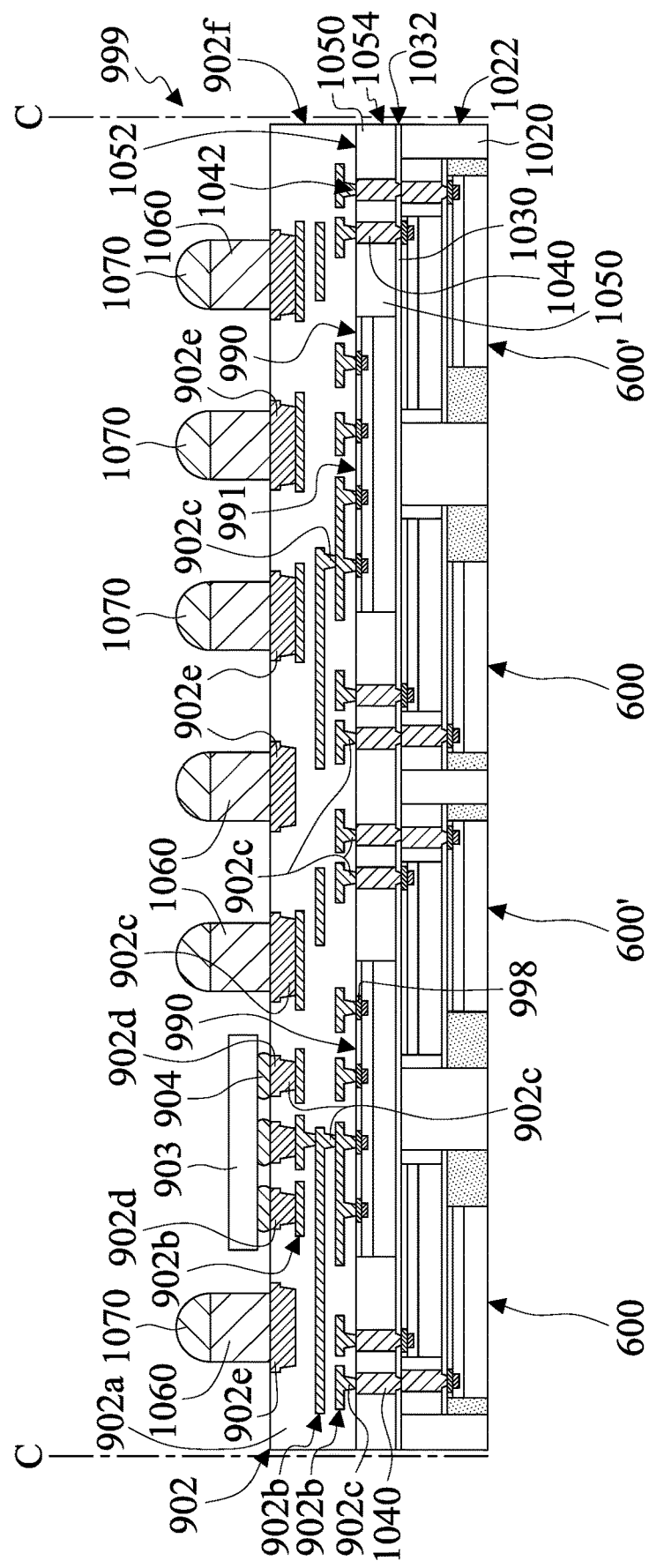

As shown in FIG. 10C, a molding layer 1050 is formed over the insulating layer 1030, in accordance with some embodiments. The molding layer 1050 surrounds the chip structure 990 and the conductive pillars 1040, in accordance with some embodiments.

The molding layers 1020 and 1050 include a polymer material or another suitable insulating material. The polymer material includes thermosetting polymers, thermoplastic polymers, or mixtures thereof. The polymer material includes, for example, plastic materials, epoxy resin, polyimide, polyethylene terephthalate (PET), polyvinyl chloride (PVC), polymethylmethacrylate (PMMA), polymer components doped with fillers including fiber, clay, silica, glass, ceramic, inorganic particles, or combinations thereof. The molding layers 1020 and 1050 are made of a material different from that of the insulating layers 150 and 1030, in accordance with some embodiments.

As shown in FIG. 10C, a wiring structure 902 is formed over the molding layer 1050, the chip structure 990, and the conductive pillars 1040, in accordance with some embodiments. The wiring structure 902 includes a dielectric layer 902a, wiring layers 902b, conductive vias 902c, and conductive pads 902d and 902e, in accordance with some embodiments. The wiring layers 902b and conductive vias 902c are in the dielectric layer 902a, in accordance with some embodiments. The conductive pads 902d and 902e are over the dielectric layer 902a, in accordance with some embodiments.

The conductive vias 902c are between the conductive pads 902d and 902e, the wiring layers 902b, the conductive pillars 1040, and the interconnection structures 998, in accordance with some embodiments. Therefore, the conductive pads 902d and 902e, the wiring layers 902b, the conductive pillars 1040, and the interconnection structures 998 are able to be electrically connected to each other through the conductive vias 902c according to design requirements, in accordance with some embodiments.

As shown in FIG. 10C, a chip structure 903 is bonded to the conductive pads 902d through conductive bumps 904, in accordance with some embodiments. As shown in FIG. 10C, conductive bumps 1060 are formed over the conductive pads 902e, respectively, in accordance with some embodiments. The conductive bumps 1060 include copper or another suitable conductive material, in accordance with some embodiments.

As shown in FIG. 10C, solder balls 1070 are formed over the conductive bumps 1060, in accordance with some embodiments. The solder balls 1070 include tin (Sn) or another suitable conductive material. The formation of the solder balls 1070 includes forming a solder paste over the conductive bumps 1060 and reflowing the solder paste, in accordance with some embodiments.

As shown in FIGS. 10B and 10C, the molding layer 1020 is debonded from the carrier substrate 1010, in accordance with some embodiments. As shown in FIG. 10C, a cutting process is performed to cut through the molding layer 1020, the insulating layer 1030, the molding layer 1050, and the wiring structure 902 along cutting lines C into chip package structures 999, in accordance with some embodiments. For the sake of simplicity, FIG. 10C only shows one of the chip package structures 999, in accordance with some embodiments.

Each of the chip package structures 999 includes the chip package units 600 and 600', the chip structures 903 and 990, the molding layers 1020 and 1050, the insulating layers 1030, the wiring structure 902, the conductive bumps 904 and 1060, and the solder balls 1070, in accordance with some embodiments.

In some embodiments, top surfaces 991 and 1052 of the chip structures 990 and the molding layer 1050 are substantially coplanar. In some embodiments, sidewalls 1022, 1032, 1054, and 902f of the molding layer 1020, the insulating layer 1030, the molding layer 1050, and the wiring structure 902 are substantially coplanar.

Figure 10D:
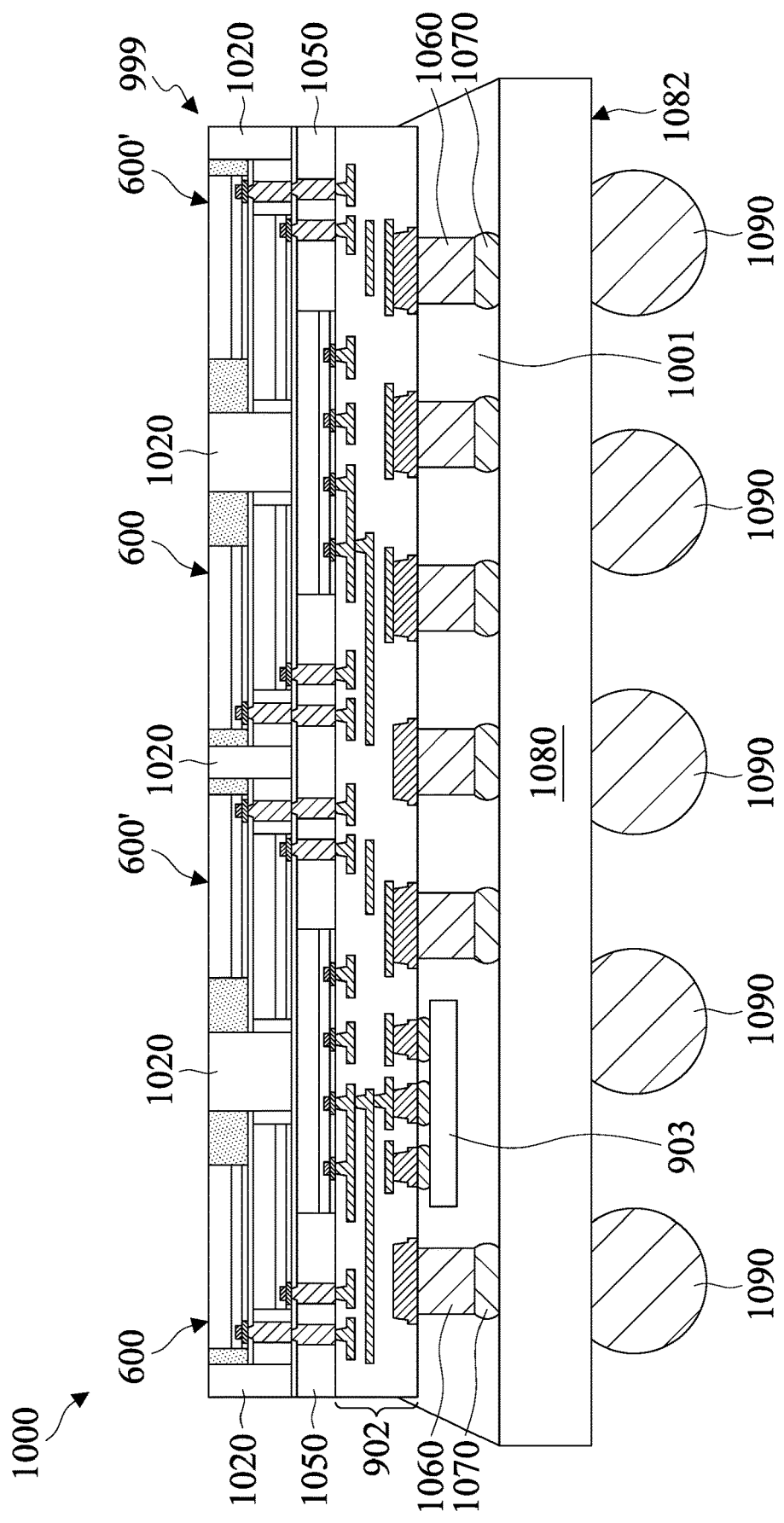

As shown in FIG. 10D, the chip package structure 999 is bonded to a wiring substrate 1080 through the solder balls 1070, in accordance with some embodiments. As shown in FIG. 10D, an underfill layer 1001 is formed between the wiring structure 902 and the wiring substrate 1080, in accordance with some embodiments. The underfill layer 1001 is made of an insulating material such as a polymer material, in accordance with some embodiments.

As shown in FIG. 10D, conductive bumps 1090 are formed over a bottom surface 1082 of the wiring substrate 1080, in accordance with some embodiments. The conductive bumps 1090 are made of tin or another suitable conductive material, in accordance with some embodiments.

FIG. 11A is a cross-sectional view of a chip package unit 1100, in accordance with some embodiments. FIG. 11B is a top view of the chip package unit 1100 of FIG. 11A, in accordance with some embodiments. FIG. 11A is a cross-sectional view illustrating the chip package unit 1100 along a sectional line I-I' in FIG. 11B, in accordance with some embodiments. For the sake of simplicity, FIG. 11B omits the molding layers 180 and 1140 and the insulating layers 150 and 1110, in accordance with some embodiments.

As shown in FIGS. 11A and 11B, the chip package unit 1100 is similar to the chip package unit 600 of FIG. 3E, except that the chip package unit 1100 further includes an insulating layer 1110, conductive pillars 1122 and 1124, a chip structure 1130, and a molding layer 1140, in accordance with some embodiments.

The insulating layer 1110 is formed over the molding layer 180 and the chip structure 170 and the conductive pillars 160, in accordance with some embodiments. The insulating layer 1110 is a continuous layer, in accordance with some embodiments. The insulating layer 1110 has holes 1112 over the interconnection structures 178 and the conductive pillars 160, in accordance with some embodiments. The holes 1112 respectively expose the interconnection structures 178 and the conductive pillars 160, in accordance with some embodiments.

In some embodiments, conductive pillars 1122 and 1124 are formed in and over the holes 1112 to be electrically connected to the interconnection structures 178 and the conductive pillars 160, respectively. The conductive pillars 1122 and 1124 include copper or another suitable conductive material. The chip structure 1130 is positioned over the insulating layer 1110, the chip structure 170 and the molding layer 180, in accordance with some embodiments.

In some embodiments, a portion of each chip structure 170 is exposed or not covered by the chip structure 1130. Each chip structure 1130 includes a chip 1132, a dielectric layer 1134, bonding pads 1136, interconnection structures 1138, and a passivation layer 1139, in accordance with some embodiments. The dielectric layer 1134 is formed over the chip 1132, in accordance with some embodiments.

The dielectric layer 1134 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 1134 is formed using a CVD process, a HDPCVD process, a spin-on process, a sputtering process, or a combination thereof, in accordance with some embodiments.

The bonding pads 1136 are formed in the dielectric layer 1134, in accordance with some embodiments. The bonding pads 1136 are electrically connected to devices (not shown) formed in/over the chip 1132, in accordance with some embodiments. The interconnection structures 1138 are formed over the bonding pads 1136 respectively, in accordance with some embodiments.

The interconnection structures 1138 include conductive pillars or conductive bumps, in accordance with some embodiments. The passivation layer 1139 is formed over the dielectric layer 1134 and surrounds the interconnection structures 1138, in accordance with some embodiments. The passivation layer 1139 includes a polymer material or another suitable insulating material.

The molding layer 1140 is formed over the insulating layer 1110, in accordance with some embodiments. The insulating layer 1110 separates the molding layer 1140 and the chip structure 1130 from the molding layer 180 and the chip structure 170, in accordance with some embodiments. The molding layer 1140 is over the chip structure 170 and the molding layer 180, in accordance with some embodiments.

The molding layer 1140 surrounds the chip structures 1130 and the conductive pillars 1122 and 1124, in accordance with some embodiments. In some embodiments, portions of the molding layer 1140 are between the chip structures 1130 and the conductive pillars 1122 and 1124. The molding layer 1140 includes a polymer material or another suitable insulating material. The molding layers 140, 180 and 1140 are made of a material different from that of the insulating layers 150 and 1110, in accordance with some embodiments.

The formation of the molding layer 1140 includes forming a molding compound material layer over the insulating layer 1110; performing a curing process to cross-link (or thermoset) the polymers of the molding compound material layer; performing a grinding process over the molding compound material layer until the conductive pillars 1122 and 1124 and the interconnection structures 1138 are exposed, in accordance with some embodiments.

Therefore, top surfaces 1138a, 1130a, 1122a, 1124a, and 1142 of the interconnection structures 1138, the chip structures 1130, the conductive pillars 1122 and 1124, and the molding layer 1140 are substantially coplanar, in accordance with some embodiments. The conductive pillars 1122 and 1124 pass through the molding layer 1140, in accordance with some embodiments.

Figure 12:
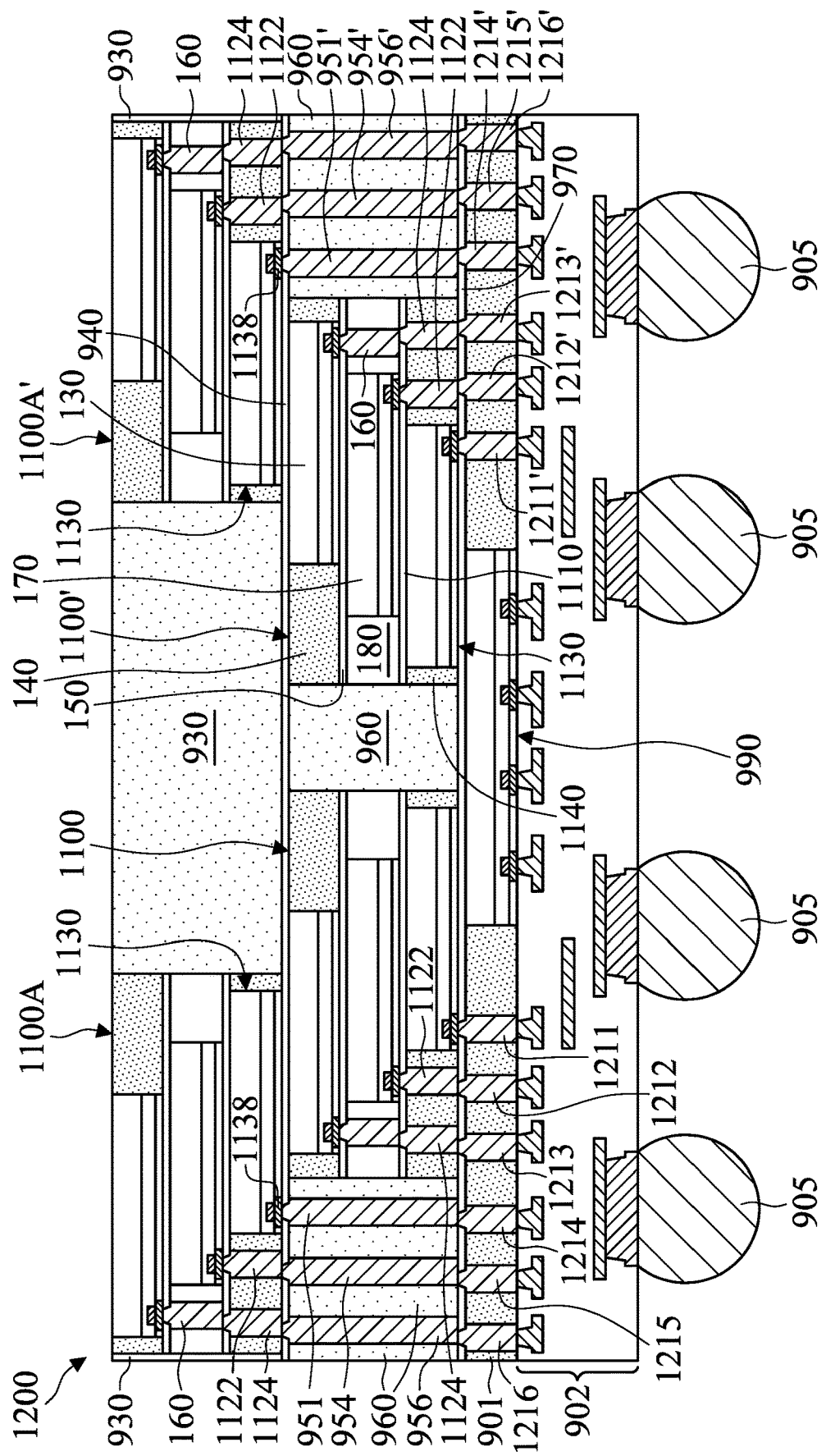
FIG. 12 is a cross-sectional view of a chip package structure, in accordance with some embodiments.

FIG. 12 is a cross-sectional view of a chip package structure 1200, in accordance with some embodiments. As shown in FIG. 12, the chip package structure 1200 is similar to the chip package structure 900 of FIG. 9E, except that in the chip package structure 1200, the chip package units 600, 600', 600A and 600A' (of the chip package structure 900) are respectively replaced with the chip package units 1100, 1100', 1100A, and 1100A', in accordance with some embodiments.

The structures of the chip package units 1100 and 1100' are similar, except that the chip package unit 1100' is (structurally) symmetrical to the chip package unit 1100, in accordance with some embodiments. Each chip package unit 1100A is structurally the same as the chip package unit 1100, in accordance with some embodiments. Each chip package unit 1100A' is structurally the same as the chip package unit 1100', in accordance with some embodiments.

The chip package structure 1200 includes conductive pillars 1211, 1212, 1213, 1214, 1215, 1216, 1211', 1212', 1213', 1214', 1215', and 1216' passing through the molding layer 901 and the insulating layer 970, in accordance with some embodiments. The chip package structure 1200 includes conductive pillars 951, 954, 956, 951', 954', and 956' passing through the molding layer 960 and the insulating layer 940, in accordance with some embodiments. The molding layers 140, 180, 901, 930, 960 and 1140 are made of a material different from that of the insulating layers 150, 940, 970 and 1110, in accordance with some embodiments.

Figure 13:
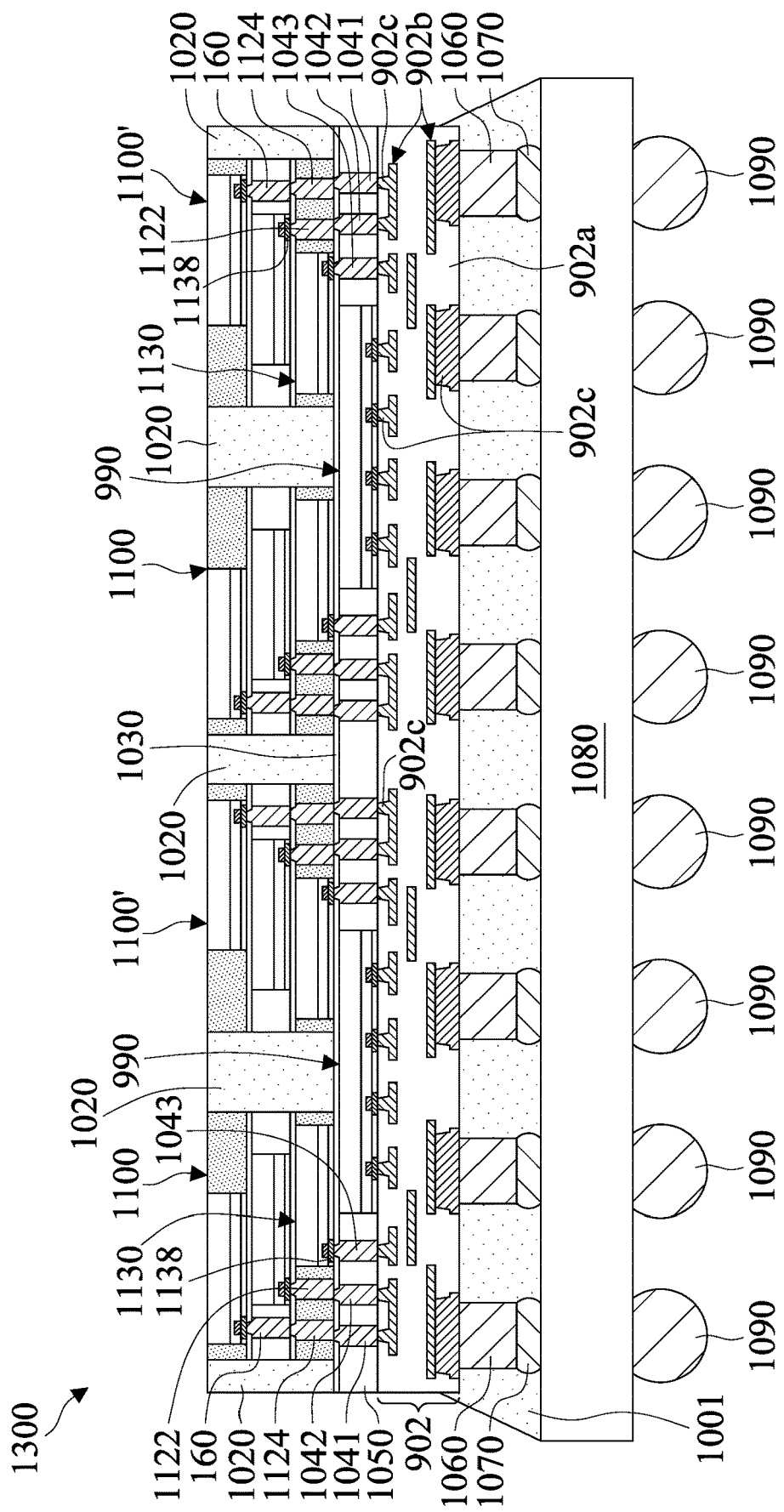
FIG. 13 is a cross-sectional view of a chip package structure, in accordance with some embodiments.

FIG. 13 is a cross-sectional view of a chip package structure 1300, in accordance with some embodiments. As shown in FIG. 13, the chip package structure 1300 is similar to the chip package structure 1000 of FIG. 10D, except that in the chip package structure 1300, the chip package units 600 and 600' (of the chip package structure 1000) are respectively replaced with the chip package units 1100 and 1100' (of the chip package structure 1200 in FIG. 12), in accordance with some embodiments.

The chip package structure 1300 includes conductive pillars 1041, 1042 and 1043 passing through the molding layer 1050 and the insulating layer 1030, in accordance with some embodiments. The conductive pillars 1041, 1042 and 1043 are connected between each chip package unit 1100 and the wiring structure 902 and between each chip package unit 1100' and the wiring structure 902, in accordance with some embodiments. The molding layers 140, 180, 1020 and 1140 are made of a material different from that of the insulating layers 150, 1030 and 1110, in accordance with some embodiments.

In accordance with some embodiments, chip package structures and methods for forming the same are provided. The methods (for forming the chip package structure) include forming chip package units in the same process and then stacking and molding the chip package units to form a chip package structure. The production time of the chip package structure is shortened and the production efficiency is improved. Therefore, the cost of the chip package structure is reduced. The chip package units may be used in various chip package structures. In the chip package structure, the conduction paths between chip structures of the chip package units and a wiring structure are shortest conduction paths (i.e., straight-line conduction paths), which improves the data transmission speed (or the signal transmission speed), the signal integrity and the power integrity.

In accordance with some embodiments, a method for forming a chip package structure is provided. The method includes forming a first molding layer surrounding a first chip structure. The method includes disposing a second chip structure over the first chip structure and the first molding layer. The method includes forming a second molding layer surrounding the second chip structure and over the first chip structure and the first molding layer. The first chip structure, the second chip structure, the first molding layer, and the second molding layer together form a first chip package unit. The method includes forming a third molding layer surrounding the first molding layer and the second molding layer. A first bottom surface of the first molding layer and a second bottom surface of the third molding layer are substantially level with each other. The method includes after forming the third molding layer surrounding the first molding layer and the second molding layer, disposing a third chip structure over the second chip structure, the second molding layer and the third molding layer. The method includes forming a fourth molding layer surrounding the third chip structure and over the second chip structure, the second molding layer, and the third molding layer.

In accordance with some embodiments, a method for forming a chip package structure is provided. The method includes providing a plurality of chip package units. Each of the chip package units includes a first chip structure, a second chip structure, a first molding layer, and a second molding layer, the first molding layer surrounds the first chip structure, the second chip structure is over the first chip structure, the second molding layer surrounds the second chip structure and is over the first molding layer, and the chip package units includes a first chip package unit, a second chip package unit, and a third chip package unit. The method includes forming a third molding layer surrounding the first chip package unit and the second chip package unit. The method includes disposing the third chip package unit over the third molding layer. The method includes forming a fourth molding layer surrounding the third chip package unit.

In accordance with some embodiments, a method for forming a chip package structure is provided. The method includes providing a plurality of chip package units. Each of the chip package units includes a first chip structure, a second chip structure, a first molding layer, and a second molding layer, the first molding layer surrounds the first chip structure, the second chip structure is over the first chip structure, the second molding layer surrounds the second chip structure and is over the first molding layer, and the chip package units includes a first chip package unit, a second chip package unit, and a third chip package unit. The method includes forming a third molding layer surrounding the first chip package unit, the second chip package unit, and the third chip package unit. The method includes forming a third chip structure over the first chip package unit and the second chip package unit. The method includes forming a fourth molding layer surrounding the third chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:

forming a first molding layer surrounding a first chip structure;

disposing a second chip structure over the first chip structure and the first molding layer;

forming a second molding layer surrounding the second chip structure and over the first chip structure and the first molding layer, wherein the first chip structure, the second chip structure, the first molding layer, and the second molding layer together form a first chip package unit;

providing a second chip package unit and a third chip package unit, wherein the second chip package unit is between the first chip package unit and the third chip package unit, the second chip package unit comprises a third chip structure and a fourth chip structure over the third chip structure, and the third chip package unit comprises a fifth chip structure and a sixth chip structure over the fifth chip structure;

forming a third molding layer surrounding the first molding layer, the second molding layer, the second chip package unit, and the third chip package unit, wherein the third molding layer separates the first chip package unit from the second chip package unit and separates the second chip package unit from the third chip package unit, a first bottom surface of the first molding layer and a second bottom surface of the third molding layer are substantially level with each other, and the third molding layer exposes a third bottom surface of the first chip package unit, a fourth bottom surface of the second chip package unit, and a fifth bottom surface of the third chip package unit;

forming a first insulating layer over the second chip structure, the second molding layer, the third molding layer, the second chip package unit, and the third chip package unit;

after forming the first insulating layer over the second chip structure, the second molding layer and the third molding layer, disposing a seventh chip structure over the first insulating layer, the second chip structure, the second molding layer, the third molding layer, and the second chip package unit, wherein the seventh chip structure overlaps the second chip structure and the fourth chip structure;

forming a fourth molding layer surrounding the seventh chip structure and over the first insulating layer, the second chip structure, the second molding layer and the third molding layer, wherein the first insulating layer is made of a first material, the third molding layer is made of a second material, the fourth molding layer is made of a third material, the first material is different from the second material and the third material, and the first insulating layer separates the fourth molding layer from the third molding layer and is in contact with the second chip structure and the seventh chip structure; and cutting through the third molding layer, the first insulating layer, and the fourth molding layer, wherein a boundary between the fourth molding layer and the first insulating layer is connected to a first sidewall of the fourth molding layer.

2. The method for forming the chip package structure as claimed in claim 1, wherein a second sidewall of the first molding layer and a third sidewall of the second molding layer are substantially level with each other.

3. The method for forming the chip package structure as claimed in claim 2, wherein a fourth sidewall of the third molding layer and the first sidewall of the fourth molding layer are substantially level with each other.

4. The method for forming the chip package structure as claimed in claim 3, further comprising:

before disposing the second chip structure over the first chip structure and the first molding layer, forming a second insulating layer over the first chip structure and the first molding layer, wherein the second chip structure is disposed over the second insulating layer.

5. The method for forming the chip package structure as claimed in claim 4, wherein the second sidewall of the first molding layer, the third sidewall of the second molding layer, and a fifth sidewall of the second insulating layer are substantially level with each other.

6. The method for forming the chip package structure as claimed in claim 1, wherein the fourth molding layer is further formed over the second chip package unit and the third chip package unit.

7. The method for forming the chip package structure as claimed in claim 1, wherein the second chip package unit comprises:

the third chip structure;
a fifth molding layer surrounding the third chip structure;
the fourth chip structure over the third chip structure; and
a sixth molding layer surrounding the fourth chip structure.

8. The method for forming the chip package structure as claimed in claim 7, wherein the second chip package unit further comprises:

a second insulating layer between the fifth molding layer and the sixth molding layer and between the third chip structure and the fourth chip structure.

9. The method for forming the chip package structure as claimed in claim 1, wherein a second sidewall of the first insulating layer is exposed by the third molding layer and the fourth molding layer after cutting through the third molding layer, the first insulating layer, and the fourth molding layer.

10. The method for forming the chip package structure as claimed in claim 1, wherein the second bottom surface of the third molding layer, the third bottom surface of the first chip package unit, the fourth bottom surface of the second chip package unit, and the fifth bottom surface of the third chip package unit are substantially level with each other.

11. A method for forming a chip package structure, comprising:

providing a plurality of chip package units, wherein each of the chip package units comprises a first chip structure, a second chip structure, a first insulating layer, a first molding layer, and a second molding layer, the first molding layer surrounds the first chip structure, the second chip structure is over the first chip structure, the second molding layer surrounds the second chip structure and is over the first molding layer, the first insulating layer is between the first molding layer and the second molding layer and between the first chip structure and the second chip structure, the first insulating layer is made of a first material, the first molding layer is made of a second material, the second molding layer is made of a third material, the first material is different from the second material and the third material, a boundary between the second molding layer and the first insulating layer is connected to a first sidewall of the second molding layer, and the chip package units comprises a first chip package unit, a second chip package unit, and a third chip package unit;

forming a third molding layer surrounding the first chip package unit, the second chip package unit, and the third chip package unit, wherein a first top surface of the first chip package unit, a second top surface of the second chip package unit, a third top surface of the third chip package unit, and a fourth top surface of the third molding layer are substantially level with each other;

forming a second insulating layer over the first chip package unit, the second chip package unit, the third chip package unit, and the third molding layer;

disposing a third chip structure over the second insulating layer, the third molding layer, the first chip package unit and the second chip package unit, wherein the third chip structure overlaps the first chip package unit and the second chip package unit;

forming a fourth molding layer surrounding the third chip structure, wherein the second insulating layer separates the fourth molding layer from the third molding layer and is in contact with the third chip structure, the first chip package unit, the second chip package unit, and the third chip package unit; and cutting through the third molding layer, the second insulating layer, and the fourth molding layer, wherein a boundary between the fourth molding layer and the second insulating layer is connected to a second sidewall of the fourth molding layer.

12. The method for forming the chip package structure as claimed in claim 11, wherein the first insulating layer separates the first molding layer from the second molding layer.

13. The method for forming the chip package structure as claimed in claim 11, wherein a third sidewall of the first insulating layer is exposed by the first molding layer and the second molding layer.

14. The method for forming the chip package structure as claimed in claim 11, wherein the chip package units further comprises a fourth chip package unit, and the third molding layer further surrounds the fourth chip package unit.

15. The method for forming the chip package structure as claimed in claim 14, wherein a fifth top surface of the fourth chip package unit, the first top surface of the first chip package unit, the second top surface of the second chip package unit, the third top surface of the third chip package unit, and the fourth top surface of the third molding layer are substantially level with each other.

16. The method for forming the chip package structure as claimed in claim 14, further comprising:
  forming a fourth chip structure over the second insulating layer, the third molding layer, the third chip package unit, and the fourth chip package unit.

17. The method for forming the chip package structure as claimed in claim 14, wherein a first bottom surface of the first chip package unit, a second bottom surface of the second chip package unit, a third bottom surface of the third chip package unit, a fourth bottom surface of the fourth chip package unit, and a fifth bottom surface of the third molding layer are substantially level with each other.

18. A method for forming a chip package structure, comprising:
  providing a plurality of chip package units, wherein each of the chip package units comprises a first chip structure, a second chip structure, a first molding layer, and a second molding layer, the first molding layer surrounds the first chip structure, the second chip structure is over the first chip structure, the second molding layer surrounds the second chip structure and is over the first molding layer, and the chip package units comprises a first chip package unit, a second chip package unit, and a third chip package unit;
  forming a third molding layer surrounding the first chip package unit, the second chip package unit, and the third chip package unit, wherein a first bottom surface of the first chip package unit, a second bottom surface of the second chip package unit, a third bottom surface of the third chip package unit, and a fourth bottom surface of the third molding layer are substantially level with each other;
  forming an insulating layer over the first chip package unit, the second chip package unit, the third chip package unit, and the third molding layer;
  forming a third chip structure over the insulating layer, the first chip package unit and the second chip package unit;
  forming a fourth molding layer surrounding the third chip structure and over the insulating layer, wherein the insulating layer is made of a first material, the third molding layer is made of a second material, the fourth molding layer is made of a third material, and the first material is different from the second material and the third material; and
  cutting through the third molding layer, the insulating layer, and the fourth molding layer, wherein a boundary between the fourth molding layer and the insulating layer is connected to a second sidewall of the fourth molding layer after the fourth molding layer is cut.

19. The method for forming the chip package structure as claimed in claim 18, wherein a first top surface of the first chip package unit, a second top surface of the second chip package unit, a third top surface of the third chip package unit, and a fourth top surface of the third molding layer are substantially level with each other.

20. The method for forming the chip package structure as claimed in claim 18, wherein the boundary between the fourth molding layer and the insulating layer extends across a second sidewall of the first chip package unit.

\* \* \* \* \*